(12) United States Patent
Murakami et al.

(10) Patent No.: US 12,305,081 B2
(45) Date of Patent: May 20, 2025

(54) POLISHING COMPOSITION

(71) Applicant: JAPAN VAM & POVAL CO., LTD., Osaka (JP)

(72) Inventors: Takashi Murakami, Osaka (JP); Yoshihiro Kimura, Osaka (JP)

(73) Assignee: JAPAN VAM & POVAL CO., LTD., Osaka (JP)

(*) Notice: Subject to any disclaimer, the term of this patent is extended or adjusted under 35 U.S.C. 154(b) by 198 days.

(21) Appl. No.: 17/793,260

(22) PCT Filed: Jan. 22, 2021

(86) PCT No.: PCT/JP2021/002202
§ 371 (c)(1),
(2) Date: Jul. 15, 2022

(87) PCT Pub. No.: WO2021/149791
PCT Pub. Date: Jul. 29, 2021

(65) Prior Publication Data
US 2023/0055305 A1 Feb. 23, 2023

(30) Foreign Application Priority Data

Jan. 22, 2020 (JP) .................. 2020-008077
Feb. 20, 2020 (JP) .................. 2020-027612

(51) Int. Cl.
C09G 1/02 (2006.01)
H01L 21/306 (2006.01)

(52) U.S. Cl.
CPC .......... C09G 1/02 (2013.01); H01L 21/30625 (2013.01)

(58) Field of Classification Search
CPC ....... C09G 1/02; C09G 1/16; H01L 21/30625; H01L 21/02024; H01L 21/304; B24B 37/00; B82B 1/00; C08F 8/12; C08K 3/36; C08L 29/04; C09K 3/14; C09K 3/1463
USPC .............................. 438/690–693; 51/307–309
See application file for complete search history.

(56) References Cited

U.S. PATENT DOCUMENTS

| | | | |
|---|---|---|---|
| 2005/0054203 A1 | 3/2005 | Yamada | |
| 2006/0135045 A1 | 6/2006 | Bian et al. | |
| 2010/0003821 A1 | 1/2010 | Morinaga et al. | |
| 2015/0079789 A1* | 3/2015 | Mori | B24B 37/044 438/693 |
| 2015/0123027 A1 | 5/2015 | Sakaida et al. | |
| 2016/0271988 A1 | 9/2016 | Oharuda et al. | |
| 2016/0272846 A1* | 9/2016 | Tsuchiya | H01L 21/02024 |
| 2019/0062595 A1 | 2/2019 | Taniguchi et al. | |
| 2019/0077992 A1 | 3/2019 | Tsuchiya et al. | |
| 2019/0359856 A1 | 11/2019 | Tsuchiya et al. | |

FOREIGN PATENT DOCUMENTS

| | | |
|---|---|---|
| CN | 105636996 | 6/2016 |
| CN | 108410288 | 8/2018 |
| JP | 2005-85858 | 3/2005 |
| JP | 2006-186356 | 7/2006 |
| JP | 2010-34509 | 2/2010 |
| JP | 2010-285488 | 12/2010 |
| JP | 2012-152954 | 8/2012 |
| JP | 2014-81528 | 5/2014 |
| JP | 2015-84379 | 4/2015 |
| JP | 2015-159259 | 9/2015 |
| JP | 2016-213216 | 12/2016 |
| JP | 2018-30765 | 3/2018 |
| JP | 2019-151849 | 9/2019 |
| JP | 2019-195020 | 11/2019 |
| WO | 2013/176122 | 11/2013 |
| WO | 2015/053207 | 4/2015 |
| WO | 2017/150118 | 9/2017 |
| WO | 2018/096991 | 5/2018 |

OTHER PUBLICATIONS

International Search Report (ISR) issued Mar. 9, 2021 in International (PCT) Application No. PCT/JP2021/002202.
International Preliminary Report on Patentability and Written Opinion of the International Searching Authority issued Jul. 26, 2022 in International (PCT) Application No. PCT/JP2021/002202.
Wang Mengzhong, et al., "Adhesive Application Manual", Chemical Industry Press, Nov. 30, 1987, p. 252 (related part is yellow-markered), with Partial English-language Translation.

* cited by examiner

*Primary Examiner* — Duy Vu N Deo
(74) *Attorney, Agent, or Firm* — Wenderoth, Lind & Ponack, L.L.P.

(57) ABSTRACT

Provided is a novel polishing composition. The polishing composition comprises a water-soluble polymer at least comprising a vinyl alcohol-based resin having a side-chain group of 3 carbon atoms or more.

25 Claims, No Drawings

POLISHING COMPOSITION

TECHNICAL FIELD

The present invention relates to a novel polishing composition etc.

BACKGROUND ART

The surface of silicon wafers, which are used as components of semiconductor devices etc., is generally polished to a high-quality mirror finish through a lapping step (rough polishing step) and a polishing step (precision polishing step). The polishing step typically includes a primary polishing substep and a final polishing substep.

The polishing step uses polishing compositions.

Polishing compositions comprising water-soluble polymers are known. For example, Patent Literature 1 describes a polishing composition comprising hydroxyethyl cellulose and/or polyvinyl alcohol and a blocked polyether.

In addition, Patent Literature 2 discloses a semiconductor wetting agent comprising a water-soluble polymer (hydroxyethyl cellulose, polyvinyl alcohol, polyvinylpyrrolidone, etc.) having a certain viscosity.

In recent years, semiconductor substrates such as silicon wafers and other substrates having higher-quality surfaces have been increasingly demanded.

More specifically, there is a need to reduce surface microdefects (e.g., surface defects called light point defects (LPD)) and surface roughness. Surface defects are known to be detectable by light scattering as localized light scattering (LLS) defects.

CITATION LIST

Patent Literature

Patent Literature 1: JP-A 2005-85858
Patent Literature 2: JP-A 2010-34509

SUMMARY OF INVENTION

Technical Problem

An object of the present invention is to provide a novel polishing composition.

Another object of the present invention is to provide a polishing composition that can be used for polishing, in particular, semiconductor substrates such as silicon wafers, to achieve a reduced number of microdefects on the polished surface.

Another object of the present invention is to provide a polishing composition that can be used for polishing the aforementioned substrates to achieve a reduced haze on the polished surface.

Another object of the present invention is to provide a polishing composition that can be used for polishing the aforementioned substrates to achieve a reduced roughness as measured by atomic force microscopy (AFM roughness) on the polished surface.

Yet another object of the present invention is to provide a method for producing a polished product using such a polishing composition.

Solution to Problem

The present inventors focused on finer sized defects on the polished surface of substrates such as semiconductor substrates and found that when a polishing composition comprising a water-soluble polymer was used for polishing the surface of semiconductor substrates, some types of water-soluble polymers were attributed to more microdefects on the polished surface.

After conducting extensive research to solve the above problem, the present inventors found that a polishing composition comprising a specific water-soluble polymer and other components can be used for polishing semiconductor substrates to achieve a reduced number of microdefects (in particular, LLS defects of 26 nm or larger or 19 nm or larger in size) on the polished surface.

In addition, the present inventors found that such a polishing composition can be used for polishing semiconductor substrates to achieve a reduced haze and AFM roughness on the polished surface.

That is, the present invention relates to the following.

[1] A polishing composition comprising a water-soluble polymer, wherein the water-soluble polymer at least comprises a vinyl alcohol-based resin (A) having a side-chain group of 3 carbon atoms or more.

[2] A polishing composition comprising a water-soluble polymer, wherein the water-soluble polymer at least comprises at least one vinyl alcohol-based resin (B) selected from a vinyl alcohol-based resin (B1) and a vinyl alcohol-based resin (B2), wherein the vinyl alcohol-based resin (B1) has a saponification value of more than 90 mol % and a viscosity of 300 mPa·s or less as measured in a 4% aqueous solution of the vinyl alcohol-based resin (B1) at 20° C., and wherein the vinyl alcohol-based resin (B2) has a saponification value of 90 mol % or less.

[3] The polishing composition according to the above [1], wherein the side-chain group comprises at least one group selected from a group derived from a $C_{7-30}$ fatty acid vinyl ester, a group derived from a $C_{3-30}$ alkyl vinyl ether, a group derived from an aromatic carboxylic acid vinyl ester, a group derived from diacetone (meth)acrylamide, an acetoacetyl group, and an epoxy ring-opening product of a group derived from an epoxy group-containing vinyl monomer.

[4] The polishing composition according to the above [1], wherein the side-chain group comprises at least one group selected from a group derived from a vinyl ester of a fatty acid having 3 carbon atoms or more, a group derived from an aromatic carboxylic acid vinyl ester, a group derived from diacetone (meth)acrylamide, and a polyoxyethylene group.

[5] The polishing composition according to the above [1] or [3], wherein the side-chain group comprises at least one group selected from a group derived from a $C_{3-30}$ alkyl vinyl ether and a group derived from diacetone (meth)acrylamide.

[6] The polishing composition according to any one of the above [1] and [3] to [5], wherein the side-chain group at least comprises a group derived from diacetone (meth)acrylamide.

[7] The polishing composition according to the above [1], wherein the side-chain group of 3 carbon atoms or more in the vinyl alcohol-based resin (A) comprises a group derived from an alkyl vinyl ether having 4 carbon atoms or more, wherein a 4% aqueous solution of the vinyl alcohol-based resin (A) has a viscosity of 100 mPa·s or more at 20° C., and wherein the vinyl alcohol-based resin (A) has a number-average molecular weight of 10,000 or more.

[8] The polishing composition according to any one of the above [1] and [3] to [7], wherein the amount of the side-chain group is 0.05 mol % or more in terms of polymerization components (monomers).

[9] The polishing composition according to the above [2], wherein the water-soluble polymer comprises the vinyl alcohol-based resin (B1).

[10] The polishing composition according to the above [2], wherein the vinyl alcohol-based resin (B) substantially consists of a vinyl alcohol unit and a vinyl ester unit.

[11] The polishing composition according to any one of the above [1] and [3] to [8], wherein the vinyl alcohol-based resin (A) has a saponification value of 80 to 99.9 mol %, and wherein a 4% aqueous solution of the vinyl alcohol-based resin (A) has a viscosity of 1 to 300 mPa·s at 20° C.

[12] The polishing composition according to any one of the above [1] to [11], further comprising abrasive grains.

[13] The polishing composition according to any one of the above [1] to [12], further comprising a pH adjuster.

[14] The polishing composition according to any one of the above [1] to [13], further comprising abrasive grains and a pH adjuster, wherein the abrasive grains comprise silica, and wherein the pH adjuster comprises a basic compound.

[15] The polishing composition according to the above [2], wherein the water-soluble polymer comprises the vinyl alcohol-based resin (B2), and wherein the abrasive grains comprise silica.

[16] The polishing composition according to any one of the above [1] to [15], further comprising a surfactant.

[17] The polishing composition according to any one of the above [1] to [16], further comprising a surfactant, wherein the surfactant comprises at least one selected from polyoxyethylene alkyl ethers and copolymers having an oxyethylene-oxypropylene structure.

[18] The polishing composition according to any one of the above [1] to [17], further comprising a surfactant, wherein the mass ratio of the water-soluble polymer and the surfactant is 1:0.01 to 1:200.

[19] The polishing composition according to any one of the above [1] to [18], further comprising a solvent at least containing water, wherein the concentration of the water-soluble polymer in the polishing composition is 1 ppm or more.

[20] The polishing composition according to any one of the above [1] to [19], further comprising a solvent at least containing water, wherein the polishing composition has a solid content of 0.01 mass % or more.

[21] A polishing composition comprising a water-soluble polymer, wherein when a workpiece to be polished has been polished with the polishing composition and cleaned, the polished surface of the workpiece satisfies the following requirement (A):
(A) the number of localized light scattering (LLS) defects of 26 nm or larger in size per area of 300 mm in diameter is 700 or smaller.

[22] A polishing composition comprising a water-soluble polymer, wherein when a workpiece to be polished has been polished with the polishing composition and cleaned, the polished surface of the workpiece satisfies the following requirement (B):
(B) the number of localized light scattering (LLS) defects of 19 nm or larger in size per area of 300 mm in diameter is 850 or smaller.

[23] A method for producing a polished product, comprising the step of polishing the surface of a workpiece to be polished with the polishing composition according to any one of the above [1] to [22].

[24] The method for producing a polished product according to the above [23], further comprising the step of diluting the polishing composition with a solvent at least containing water, wherein the polishing step uses the diluted solution obtained in the dilution step to polish the surface of the workpiece.

[25] The method for producing a polished product according to the above or [24], wherein the polished product has a surface that satisfies the following requirement (A):
(A) the number of localized light scattering (LLS) defects of 26 nm or larger in size per area of 300 mm in diameter is 700 or smaller.

[26] A polished product having a surface that satisfies the following requirement (A):
(A) the number of localized light scattering (LLS) defects of 26 nm or larger in size per area of 300 mm in diameter is 700 or smaller.

[27] A method for reducing the number of localized light scattering (LLS) defects on a polished surface, comprising the step of polishing a surface of a workpiece to be polished with the polishing composition of any one of the above [1] to [22].

Advantageous Effects of Invention

The present invention provides a novel polishing composition.

This composition can be used for polishing, in particular, semiconductor substrates such as silicon wafers, to achieve a reduced number of microdefects (in particular, LLS defects of 26 nm or larger or 19 nm or larger in size) on the polished surface, thereby enabling the production of a polished product with a high-quality surface.

In addition, the composition can be used for polishing the aforementioned substrates to achieve a reduced haze on the polished surface, thereby enabling the production of a polished product with a high-quality surface.

Furthermore, the composition can be used for polishing the aforementioned substrates to achieve a reduced AFM roughness (in particular, long-wavelength roughness) on the polished surface, thereby enabling efficient focusing during exposure in semiconductor device fabrication.

Furthermore, the composition can be used to facilitate efficient fabrication of semiconductor devices etc.

The present invention provides a method for producing a polished product using the composition described above.

DESCRIPTION OF EMBODIMENTS

Composition

The composition of the present invention usually comprises a specific water-soluble polymer, which is described later. The composition of the present invention can be used, in particular, for polishing.

Water-Soluble Polymer

The water-soluble polymer in the composition may comprise a vinyl alcohol-based resin (A) having a side-chain group of 3 carbon atoms or more.

Vinyl Alcohol-Based Resin (A)

The vinyl alcohol-based resin is usually a polyvinyl alcohol-based resin (sometimes referred to as a PVA-based resin, PVA, etc.) and is a saponified product of a vinyl ester-based polymer (a polymer composed of a vinyl ester as at least a polymerization component).

The vinyl ester (vinyl ester monomer) is not particularly limited, and examples include fatty acid vinyl esters [e.g., $C_{1-30}$ fatty acid vinyl esters (e.g., $C_{1-16}$ alkanoic acid vinyl esters) such as vinyl formate, vinyl acetate, vinyl propionate, vinyl butyrate, vinyl caprylate, vinyl versatate, and vinyl monochloroacetate], and aromatic carboxylic acid vinyl esters [e.g., vinyl arenecarboxylates (e.g., $C_{7-12}$ arene carboxylic acid vinyl esters) such as vinyl benzoate].

A single kind of vinyl ester or a combination of two or more kinds of vinyl esters may be used.

The vinyl ester preferably at least comprises a fatty acid vinyl ester (e.g., $C_{1-10}$ alkanoic acid vinyl esters etc., such as vinyl formate, vinyl acetate, vinyl propionate, and vinyl butyrate). In particular, it is industrially preferable that the vinyl ester comprises vinyl acetate.

If necessary, the vinyl ester-based polymer may have an additional monomer unit (a monomer capable of copolymerizing with vinyl esters) (in other words, the vinyl ester-based polymer may be modified with an additional monomer).

The additional monomer is not particularly limited, and examples include, but are not limited to, alkyl vinyl ethers (e.g., $C_{1-30}$ alkyl vinyl ethers, preferably $C_{1-16}$ alkyl vinyl ethers, such as hexadecyl vinyl ether), epoxy group-containing vinyl monomers {e.g., vinyl glycidyl ethers (e.g., allyl glycidyl ether, (meth)acrylic glycidyl ether, 4-(meth)acrylamidophenyl glycidyl ether, 3-(meth)acrylamidophenyl glycidyl ether, N-glycidoxymethyl (meth)acrylamide, N-glycidoxyethyl (meth)acrylamide, N-glycidoxypropyl (meth)acrylamide, N-glycidoxybutyl (meth)acrylamide, and 4-(meth)acrylamidomethyl-2, 5-dimethyl-phenylglycidyl ether), epoxy group-containing α-olefins (e.g., 1, 2-epoxy-5-hexene, 1, 2-epoxy-7-octene, 1, 2-epoxy-9-decene, 8-hydroxy-6, 7-epoxy-1-octene, and 8-acetoxy-6, 7-epoxy-1-octene), N-(2, 3-epoxy) propyl (meth)acrylamide, (meth) acrylamidopropyldimethyl (2, 3-epoxy) propyl ammonium chloride, glycidyl (meth)acrylate, etc.}, α-olefins (e.g., ethylene, propylene, etc.), (meth)acrylic acid esters [e.g., (meth)acrylic acid alkyl esters such as methyl (meth)acrylate, ethyl (meth)acrylate, butyl (meth)acrylate, and 2-ethylhexyl (meth)acrylate; and diacetone (meth)acrylate], unsaturated amides [e.g., (meth)acrylamide, diacetone (meth)acrylamide, N-methylolacrylamide, etc.], unsaturated acids {e.g., unsaturated acids [e.g., (meth)acrylic acid, crotonic acid, maleic acid, itaconic acid, fumaric acid, etc.], unsaturated acid esters [unsaturated acid esters other than (meth)acrylic acid esters, e.g., alkyl(methyl, ethyl, propyl, etc.) esters etc.], unsaturated acid anhydrides (maleic anhydride etc.), salts of unsaturated acids [e.g., alkali metal salts (e.g., sodium salts, potassium salts, etc.), ammonium salts, etc.], etc.}, glycidyl group-containing monomers [e.g., allyl glycidyl ethers, glycidyl (meth)acrylate, etc.], sulfonic group-containing monomers (e.g., 2-acrylamide-2-methyl-propane sulfonic acid, salts thereof, etc.), phosphate group-containing monomers [e.g., acid phosphoxy ethyl (meth) acrylate, acid phosphoxy propyl (meth)acrylate, etc.], allyl alcohols, diacetone (meth)acrylamide, etc.

A single kind of additional monomer or a combination of two or more kinds of additional monomers may be used.

The vinyl ester units and/or additional monomer units may be modified to the extent that such modification does not interfere with the effects of the present invention.

The vinyl ester units may be modified, for example, by acetalization, etherification, acetoacetylation, cationization, polyoxyalkylene modification, etc.

The additional monomer units may be modified by, for example, a ring-opening reaction of an epoxy group (e.g., reaction of an epoxy group with a thiol).

The modification method is not particularly limited. For acetoacetylation of the vinyl ester units, for example, a vinyl alcohol-based resin can be reacted with a diketene.

The method for reacting a vinyl alcohol-based resin with a diketene is not particularly limited, and examples include the following: a vinyl alcohol-based resin is reacted directly with a gaseous or liquid diketene; an organic acid is pre-adsorbed onto a vinyl alcohol-based resin, and a gaseous or liquid diketene is then sprayed onto the resin under an inert gas atmosphere; and a mixture of an organic acid and a liquid diketene is sprayed onto a vinyl alcohol-based resin.

The ring-opening reaction of an epoxy group in the additional monomer unit can be performed, for example, by reacting an epoxy group-containing vinyl monomer unit with a thiol (e.g., a thiol having an amino group).

The vinyl alcohol-based resin (A) at least has a side-chain group of 3 carbon atoms or more [e.g., 3 to 30 carbon atoms, 4 to 30 carbon atoms, 5 to 30 carbon atoms, 6 to 30 carbon atoms, 7 carbon atoms or more (e.g., 7 to 30 carbon atoms), etc.].

The side-chain group of 3 carbon atoms or more may have one or more kinds of heteroatoms (e.g., a nitrogen atom, an oxygen atom, a sulfur atom, etc.). The heteroatom may be located between carbon atoms in the side-chain group of 3 carbon atoms or more.

The side-chain group of 3 carbon atoms or more may have a substituent (e.g., an amino group, etc.).

The vinyl alcohol-based resin (A) may have one or more kinds of side-chain groups of 3 carbon atoms or more.

The side-chain group of 3 carbon atoms or more may be part of the monomer that is a polymerization component of the vinyl ester-based polymer (i.e., the side-chain group of 3 carbon atoms or more may be a group in the monomer of the vinyl ester-based polymer). Alternatively, the side-chain group of 3 carbon atoms or more may be introduced into the vinyl ester-based polymer or the saponified product of the vinyl ester-based polymer by modifying part of the vinyl ester-based polymer or the saponified product of the vinyl ester-based polymer.

The side-chain group of 3 carbon atoms or more is, for example, a group having an alkyl group (e.g., a $C_{3-30}$ alkyl group, preferably a $C_{3-20}$ alkyl group, more preferably a $C_{6-20}$ alkyl group), a group having an aryl group (e.g., a $C_{6-30}$ aryl group, preferably a $C_{6-20}$ aryl group, more preferably a $C_{11-20}$ aryl group), a group having a group represented by the formula (1) shown below, a group having a polyoxyalkylene group (e.g., a polyoxy $C_{2-6}$ alkylene group such as a polyoxyethylene group or a polyoxypropylene group), a group having an acetoacetyl group, an epoxy ring-opening product of a group derived from an epoxy group-containing vinyl monomer (e.g., an epoxy group-containing vinyl monomer as exemplified above), etc.

[Chem. 1]

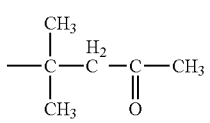

Formula (1)

These groups may be bound to the main chain of the vinyl alcohol-based resin (A) directly or via a linking group (e.g., an ether bond, an ester bond, an amide bond, a urethane bond, etc.).

Specific examples of the group having an alkyl group include groups derived from $C_{3-30}$ fatty acid vinyl esters (e.g., $C_{3-30}$ alkanoic acid vinyl esters, preferably $C_{7-30}$ alkanoic acid vinyl esters, more preferably $C_{7-20}$ alkanoic acid vinyl esters) such as vinyl propionate, vinyl butyrate, vinyl caprylate, and vinyl versatate; groups derived from $C_{3-30}$ alkyl vinyl ethers [e.g., $C_{7-30}$ alkyl vinyl ethers, preferably $C_{7-20}$ alkyl vinyl ethers (e.g., $C_{11-20}$ alkyl vinyl ethers, $C_{13-20}$ alkyl vinyl ethers, etc.) such as hexadecyl vinyl ether]; and urethane alkyl groups having a $C_{3-30}$ alkyl group (e. g., a $C_{7-30}$ alkyl group, a $C_{11-30}$ alkyl group, etc.).

Specific examples of the group having an aryl group include groups derived from aromatic carboxylic acid vinyl esters [e.g., vinyl arenecarboxylates (e.g., $C_{7-12}$ arene carboxylic acid vinyl esters) such as vinyl benzoate].

Specific examples of the group having the group represented by the above formula (1) include groups derived from diacetone (meth)acrylamide, and groups derived from diacetone (meth)acrylate.

Examples of the epoxy ring-opening product of a group derived from an epoxy group-containing vinyl monomer include products obtained by a ring-opening reaction of an epoxy group in the group derived from an epoxy group-containing vinyl monomer (e.g., reaction of an epoxy group with a thiol).

The ring-opening reaction of the epoxy group can be performed in any manner without particular limitations, for example, by reacting an epoxy group-containing vinyl monomer unit with a thiol [e.g., a thiol having an amino group (such as the thiol described in U.S. Pat. No. 3,647,630) etc.] (e.g., the method described in U.S. Pat. No. 3,647,630, etc.).

The side-chain group of 3 carbon atoms or more is particularly preferably a group derived from a $C_{7-30}$ fatty acid vinyl ester, a group derived from a $C_{3-30}$ alkyl vinyl ether, a group derived from an aromatic carboxylic acid vinyl ester, a group derived from diacetone (meth)acrylamide, an acetoacetyl group, an epoxy ring-opening product of a group derived from an epoxy group-containing vinyl monomer, etc.

A single kind of vinyl alcohol-based resin (A) or a combination of two or more kinds of vinyl alcohol-based resins (A) may be used.

The vinyl alcohol-based resin (A) may be a commercial product.

The method for producing the vinyl alcohol-based resin (A) is not particularly limited, and known methods, for example, saponification of a vinyl ester-based polymer, may be used.

The polymerization method for the vinyl ester-based polymer is not particularly limited, and examples include known polymerization methods such as bulk polymerization, solution polymerization, suspension polymerization, and emulsion polymerization. Among them, solution polymerization (e.g., solution polymerization using methanol as a solvent) is industrially preferred.

In the solution polymerization, known initiators such as peroxide initiators and azo initiators can be used, and the polymerization degree of the vinyl ester-based polymer can be adjusted by varying the feed ratio of the vinyl ester monomer and a solvent and the polymerization yield.

The method for saponifying the vinyl ester-based polymer can be a conventional saponification method using an alkaline or acid catalyst. In particular, industrially preferred is alcoholysis, which is performed by adding an alkali such as sodium hydroxide to a solution of the vinyl ester-based polymer in methanol or in a mixed solvent of methanol, water, methyl acetate, etc. and stirring the mixture.

After that, the obtained mass product, gelled product, or granular product is pulverized, and optionally, the alkali is neutralized; then the solid matter is separated from the liquid matter and dried to yield a PVA-based resin.

In the case of modifying a vinyl ester-based polymer, the timing of the modification is not particularly limited and may be before or after the saponification of the vinyl ester-based polymer.

Representative examples of the vinyl alcohol-based resin (A) include saponified products of vinyl ester-based polymers composed of a vinyl ester and diacetone (meth)acrylamide as at least polymerization components; saponified products of vinyl ester-based polymers composed of a vinyl ester having a side-chain group of 3 carbon atoms or more as at least a polymerization component; and saponified products of vinyl ester-based polymers having a polyoxyalkylene modification (a polyoxyethylene group, etc.). Among them, preferred are saponified products of vinyl ester-based polymers composed of a vinyl ester and diacetone (meth)acrylamide as at least polymerization components.

The amount of the side-chain group of 3 carbon atoms or more in the vinyl alcohol-based resin (A) in terms of polymerization components (monomers) is, for example, 0.05 mol % or more, preferably 0.1 mol % or more, more preferably 0.2 mol % or more, and particularly preferably 0.5 mol % or more for the purpose of microdefect reduction etc.

In addition, the amount of the side-chain group of 3 carbon atoms or more in the vinyl alcohol-based resin (A) in terms of polymerization components (monomers) is, for example, 50 mol % or less (e. g., 40 mol % or less, 30 mol % or less, 20 mol % or less, mol % or less, 10 mol % or less, etc.) from the perspective of polishing speed etc.

These upper and lower limits may be combined to set an appropriate range (e.g., 0.05 to 50 mol %, 0.05 to 40 mol %, etc.) for the amount of the side-chain group of 3 carbon atoms or more in the vinyl alcohol-based resin (A) (the same applies to the others).

More specifically, the amount of the side-chain group of 3 carbon atoms or more in the vinyl alcohol-based resin (A) in terms of polymerization components (monomers) is, for example, 0.05 to 20 mol %, preferably 0.1 to 20 mol %, more preferably 0.2 to 20 mol %, and particularly preferably 0.2 to 15 mol % (e.g., 1 to 10 mol %, or 3 to 6 mol %).

In particular, in the case where the vinyl alcohol-based resin (A) has a group derived from diacetone (meth)acrylamide, the amount of the group derived from diacetone (meth)acrylamide in the vinyl alcohol-based resin (A) in terms of polymerization components (monomers) is, for example, 0.05 to 50 mol %, and preferably 0.2 to 20 mol % (e.g., 0.2 to 15 mol %, 1 to 10 mol %, or 3 to 6 mol %) for the purpose of haze improvement etc.

The saponification value of the vinyl alcohol-based resin (A) is not particularly limited and is, for example, 60 mol % or more (e.g., 70 mol % or more), preferably 80 mol % or more (e.g., 81 mol % or more, 82 mol % or more, 83 mol % or more, 84 mol % or more, or 85 mol % or more), and more preferably 90 mol % or more (e.g., 91 mol % or more, 92 mol % or more, 93 mol % or more, 94 mol % or more, 95 mol % or more, 96 mol % or more, 97 mol % or more, 98 mol % or more, etc.).

It is envisaged that vinyl alcohol-based resins having a relatively high saponification value would be preferred from the perspective of water solubility (solubility in a polishing solution), but according to the present inventors' studies, an excessively high saponification value has a tendency to cause an increased number of microdefects on the polished surface of silicon wafers. On the other hand, in the present invention, the use of the vinyl alcohol-based resin (A) having a side-chain group of 3 carbon atoms or more enables the reduction in microdefects on the polished surface of wafers even when the saponification value of the vinyl alcohol-based resin is relatively high.

The upper limit of the saponification value is not particularly specified. For example, the saponification value is 99.9 mol % or less, 99.5 mol % or less, 99 mol % or less, etc.

These upper and lower limits may be combined to set an appropriate range (e.g., 80 to 99.9 mol %, 85 to 99 mol %, 90 to 99 mol %, etc.) for the saponification value of the vinyl alcohol-based resin (A) (the same applies to the others). All combinations of these upper and lower limits are applicable.

The saponification value of the vinyl alcohol-based resin (A) can be measured, for example, by the method for measuring the saponification value specified in JIS K 6726.

The average polymerization degree of the vinyl alcohol-based resin (A) is not particularly limited and is, for example, 100 to 4,000, preferably 200 to 3,000, more preferably 300 to 2,000, and particularly preferably 500 to 1,000.

It was envisaged that vinyl alcohol-based resins having a relatively high average polymerization degree would be preferred because they provide better protection of the wafer surface and less damage to wafers, etc., but according to the present inventors' studies, the use of vinyl alcohol-based resins having a high average polymerization degree for polishing the surface of silicon wafers may tend to result in a greater number of microdefects on the polished surface of wafers. On the other hand, in the present invention, the use of the vinyl alcohol-based resin (A) having a side-chain group of 3 carbon atoms or more enables the reduction in microdefects on the polished surface of wafers even when the average polymerization degree of the vinyl alcohol-based resin is relatively high.

The average polymerization degree of the vinyl alcohol-based resin (A) can be measured, for example, by the method specified in JIS K 6726.

The viscosity of a 4% aqueous solution of the vinyl alcohol-based resin (A) at 20° C. is not particularly limited and is, for example, 300 mPa·s or less (e.g., 250 mPa·s or less), preferably 200 mPa·s or less (e.g., 150 mPa·s or less), and more preferably 100 mPa·s or less (e.g., 50 mPa·s or less).

The lower limit of the viscosity of the 4% aqueous solution of the vinyl alcohol-based resin (A) at 20° C. is not particularly specified. For example, the viscosity is 1 mPa·s or more, 3 mPa·s or more, etc.

These upper and lower limits may be combined to set an appropriate range (e.g., 1 to 300 mPa·s, 1 to 250 mPa·s, etc.) for the viscosity of the 4% aqueous solution of the vinyl alcohol-based resin (A) at 20° C. (the same applies to the others). All combinations of these upper and lower limits are applicable.

The viscosity of the 4% aqueous solution of the vinyl alcohol-based resin (A) at 20° C. can be measured, for example, by the method specified in JIS K 6726 (1994).

The number-average molecular weight of the vinyl alcohol-based resin (A) is not particularly limited and is, for example, 10,000 or more, 20,000 or more, 30,000 or more, 40,000 or more, 50,000 or more, etc.

The upper limit of the number-average molecular weight of the vinyl alcohol-based resin (A) is not particularly specified. For example, the number-average molecular weight is 200,000 or less, 100,000 or less, etc.

The number-average molecular weight of the vinyl alcohol-based resin (A) can be measured, for example, by GPC (e.g., aqueous GPC, expressed on a polyethylene glycol equivalent basis).

The weight-average molecular weight (Mw) of the vinyl alcohol-based resin (A) is not particularly limited. For example, in the case where the vinyl alcohol-based resin (A) has a polyoxyethylene group, the weight-average molecular weight (Mw) of the vinyl alcohol-based resin (A) is, for example, 5,000 to 200,000, preferably 10,000 to 100,000 (e.g., 10,000 to 30,000, or 35,000 to 80,000), and more preferably 15,000 to 60,000 (e.g., 20,000 to 40,000).

The weight-average molecular weight of the vinyl alcohol-based resin (A) can be measured, for example, by GPC (e.g., aqueous GPC, expressed on a polyethylene glycol equivalent basis).

The water-soluble polymer in the composition may at least comprise at least one vinyl alcohol-based resin (B) selected from a vinyl alcohol-based resin (B1), which has a saponification value of more than 90 mol % and a viscosity of 300 mPa·s or less as measured in a 4% aqueous solution of the vinyl alcohol-based resin (B1) at 20° C., and a vinyl alcohol-based resin (B2), which has a saponification value of 90 mol % or less.

Vinyl Alcohol-Based Resin (B)

The vinyl alcohol-based resin (B) is a saponified product of a vinyl ester-based polymer, as is the vinyl alcohol-based resin (A) described above.

The vinyl ester and an additional monomer in the vinyl ester-based polymer may be those as exemplified above for the vinyl alcohol-based resin (A).

Representative examples of the vinyl alcohol-based resin (B) include saponified products of vinyl ester-based polymers composed of a vinyl ester as at least a polymerization component.

The vinyl alcohol-based resin (B) may have a side-chain group of 3 carbon atoms or more (e.g., a side-chain group derived from diacetone (meth)acrylamide). The side-chain group of 3 carbon atoms or more may be a side-chain group as exemplified above for the vinyl alcohol-based resin (A).

The vinyl ester units and/or additional monomer units in the vinyl alcohol-based resin (B) may be modified to the extent that such modification does not interfere with the effects of the present invention. For example, the vinyl ester units may be modified by acetalization, etherification, acetoacetylation, cationization, polyoxyalkylene modification, or other reactions.

As described above, the vinyl alcohol-based resin (B) may comprise a unit other than the vinyl alcohol unit or the vinyl ester unit, but the amount of such a unit is preferably less than 1 mol %. More preferably, the vinyl alcohol-based resin (B) substantially consists of a vinyl alcohol unit and a vinyl ester unit.

A single kind of vinyl alcohol-based resin (B) or a combination of two or more kinds of vinyl alcohol-based resins (B) may be used.

The vinyl alcohol-based resin (B) may be a commercial product.

The method for producing the vinyl alcohol-based resin (B) may be the same as the method for producing the vinyl alcohol-based resin (A) as exemplified above.

Vinyl Alcohol-Based Resin (B1)

The saponification value of the vinyl alcohol-based resin (B1) is, for example, more than 90 mol %, 91 mol % or more, 92 mol % or more, 93 mol % or more, 94 mol % or more, 95 mol % or more, 96 mol % or more, 97 mol % or more, 98 mol % or more, etc.

Vinyl alcohol-based resins having such a relatively high saponification value are less likely to undergo a saponification reaction in aqueous solution. The use of such vinyl alcohol-based resins thus enables the production of a polishing composition which is excellent in storage stability and less prone to pH fluctuation in polishing compositions.

The upper limit of the saponification value of the vinyl alcohol-based resin (B1) is not particularly specified. For example, the saponification value is 99.9 mol % or less, 99.5 mol % or less, 99 mol % or less, etc.

These upper and lower limits may be combined to set an appropriate range (e.g., 90 to 99.9 mol %, 91 to 99 mol %, 92 to 99 mol %, etc.) for the saponification value of the vinyl alcohol-based resin (B1) (the same applies to the others). All combinations of these upper and lower limits are applicable.

The viscosity of a 4% aqueous solution of the vinyl alcohol-based resin (B1) at 20° C. may be relatively low for the purpose of microdefect reduction etc. The viscosity is, for example, 300 mPa·s or less (e.g., 250 mPa·s or less), preferably 200 mPa·s or less (e.g., 180 mPa·s or less), more preferably 150 mPa·s or less (e.g., 100 mPa·s or less), and particularly preferably 50 mPa·s or less (e.g., 40 mPa·s or less, 30 mPa·s or less, 20 mPa·s or less, or 15 mPa·s or less).

According to the present inventors' studies, the use of vinyl alcohol-based resins having a high saponification value may tend to result in a greater number of microdefects on the polished surface of silicon wafers. On the other hand, in the present invention, the use of the vinyl alcohol-based resin (B1) having a relatively low viscosity as measured in a 4% aqueous solution at 20° C. enables the reduction in microdefects on the polished surface of wafers even when the saponification value of the vinyl alcohol-based resin (B1) is high.

The lower limit of the viscosity of the 4% aqueous solution of the vinyl alcohol-based resin (B1) at 20° C. is not particularly specified. For example, the viscosity is 0.5 mPa·s or more, 1 mPa·s or more, 2 mPa·s or more, 5 mPa·s or more, mPa·s or more, 15 mPa·s or more, 20 mPa·s or more, 25 mPa·s or more, 30 mPa·s or more, 40 mPa·s or more, 50 mPa·s or more, etc.

These upper and lower limits may be combined to set an appropriate range (e.g., 0.5 to 300 mPa·s, 1 to 200 mPa·s, 2 to 50 mPa·s, etc.) for the viscosity of the 4% aqueous solution of the vinyl alcohol-based resin (B1) at 20° C. (the same applies to the others). All combinations of these upper and lower limits are applicable.

The viscosity of the 4% aqueous solution of the vinyl alcohol-based resin (B1) at 20° C. may be relatively high in the range of 300 mPa·s or less from a comprehensive perspective of LLS defects, AFM roughness and haze (e.g., 30 mPa·s or more, mPa·s or more, 50 mPa·s or more, etc.). On the other hand, in order to prevent viscosity increase and gelation during storage and to facilitate handling in aqueous solution, the viscosity of the 4% aqueous solution of the vinyl alcohol-based resin (B1) at 20° C. may be relatively low (e.g., 40 mPa·s or less, less than 40 mPa·s, 30 mPa·s or less, less than 30 mPa·s, 25 mPa·s or less, less than 25 mPa·s, 20 mPa·s or less, etc.).

The average polymerization degree of the vinyl alcohol-based resin (B1) is not particularly limited and is, for example, 100 to 4,000, preferably 200 to 3,500, more preferably 300 to 3,000, and particularly preferably 500 to 2,500 (e.g., 600 to 2,300, or 1,000 to 2,000).

The weight-average molecular weight of the vinyl alcohol-based resin (B1) is not particularly limited. For example, a vinyl alcohol-based resin having a saponification value of 95 mol % or more (B1) has a weight-average molecular weight of, for example, 4,000 to 176,000, preferably 44,000 or more. For the improvement in LLS defects on polished surfaces, the weight-average molecular weight of the vinyl alcohol-based resin (B1) is more preferably 44,000 to 88,000, and for the improvement in AFM roughness on polished surfaces, the weight-average molecular weight of the vinyl alcohol-based resin (B1) is more preferably 155,000 to 176,000.

Vinyl Alcohol-Based Resin (B2)

The saponification value of the vinyl alcohol-based resin (B2) is, for example, 90 mol % or less, 89 mol % or less, 88 mol % or less, 87 mol % or less, 86 mol % or less, 85 mol % or less, etc. for the purpose of microdefect reduction etc.

Vinyl alcohol-based resins having such a relatively low saponification value are less prone to viscosity increase during storage of aqueous vinyl alcohol-based resin solutions, which are used as components for polishing compositions.

The lower limit of the saponification value of the vinyl alcohol-based resin (B2) is not particularly specified. For example, the saponification value is 60 mol % or more, 65 mol % or more, 70 mol % or more, 75 mol % or more, 80 mol % or more, etc.

These upper and lower limits may be combined to set an appropriate range (e.g., 60 to 90 mol %, 65 to 89 mol %, 70 to 89 mol %, etc.) for the saponification value of the vinyl alcohol-based resin (B2) (the same applies to the others). All combinations of these upper and lower limits are applicable.

The viscosity of a 4% aqueous solution of the vinyl alcohol-based resin (B2) at 20° C. is not particularly limited and is, for example, 2,000 mPa·s or less, 1,000 mPa·s or less, 500 mPa·s or less, 300 mPa·s or less, 100 mPa·s or less, 50 mPa·s or less, etc.

The 4% aqueous solution viscosity of the vinyl alcohol-based resin (B2) at 20° C. may be relatively high.

It was envisaged that vinyl alcohol-based resins having a relatively high viscosity as measured in a 4% aqueous solution at 20° C. would be preferred because they provide better protection of the wafer surface and less damage to wafers, etc., but according to the present inventors' studies, the use of vinyl alcohol-based resins having a relatively high viscosity (measured in a 4% aqueous solution at 20° C.) for polishing the surface of silicon wafers may tend to result in a greater number of microdefects on the polished surface of wafers. On the other hand, in the present invention, the use of the vinyl alcohol-based resin (B2) having a relatively low saponification value enables the reduction in microdefects on the polished surface of wafers even when the viscosity of a 4% aqueous solution of the vinyl alcohol-based resin at 20° C. is relatively high.

The lower limit of the viscosity of the 4% aqueous solution of the vinyl alcohol-based resin (B2) at 20° C. is not particularly specified. For example, the viscosity is 0.5 mPa·s or more, 1 mPa·s or more, 2 mPa·s or more, etc.

These upper and lower limits may be combined to set an appropriate range (e.g., 0.5 to 2,000 mPa·s, 1 to 1,000 mPa·s, 2 to 500 mPa·s, etc.) for the viscosity of the 4% aqueous solution of the vinyl alcohol-based resin (B2) at 20° C. (the same applies to the others). All combinations of these upper and lower limits are applicable.

The average polymerization degree of the vinyl alcohol-based resin (B2) is not particularly limited and is, for example, 100 to 9,000, preferably 1,800 to 8,800, more preferably 3,700 to 8,500, and particularly preferably 4,000 to 8,000 (e.g., 4,000 to 5,000).

The weight-average molecular weight of the vinyl alcohol-based resin (B2) is not particularly limited. For example, a vinyl alcohol-based resin (B2) having a saponification value of about 88 mol % (e.g., 85 to 90 mol %) has a weight-average molecular weight of preferably 82,000 or more, more preferably 182,000 to 417,000 (e.g., 196,000 to 245,000) for the purpose of reducing the number of LLS defects and AFM roughness on polished surfaces.

The weight-average molecular weight of the vinyl alcohol-based resin (B2) having a saponification value of 75 mol % or more and less than 81 mol % is preferably 30,000 or more, 25,000 or less, etc.

The weight-average molecular weight of the vinyl alcohol-based resin (B2) having a saponification value of less than 75 mol % is preferably 10,000 or more.

The methods for measuring the saponification value, the viscosity of a 4% aqueous solution at 20° C., the average polymerization degree, and the weight-average molecular weight of the vinyl alcohol-based resin (B) may be the same as those described above for the vinyl alcohol-based resin (A).

The water-soluble polymer may comprise one or more vinyl alcohol-based resins selected from vinyl alcohol-based resins (A) and (B).

The composition may further comprise a water-soluble polymer other than the vinyl alcohol-based resin (A) or (B).

Examples of the additional water-soluble polymer include, but are not limited to, vinyl alcohol-based resins that are not included in the scope of the vinyl alcohol-based resin (A) or (B), cellulose derivatives (e.g., methyl cellulose, ethyl cellulose, hydroxyethyl cellulose, hydroxypropyl cellulose, hydroxyethyl methyl cellulose, hydroxypropyl methyl cellulose, ethyl hydroxyethyl cellulose, and carboxymethyl cellulose), starch derivatives (e.g., pullulan and cyclodextrin), imine derivatives [e.g., poly(N-acylalkyleneimine)], polyvinylpyrrolidone resins, polyvinylcaprolactam resins, acrylic resins, polyacryloyl morpholine resins, polyoxyalkylenes (e.g., polyoxyethylene), etc.

A single kind of additional water-soluble polymer or a combination of two or more kinds of additional water-soluble polymers may be used.

Surfactant

The composition of the present invention may further comprise a surfactant.

The use of the surfactant can improve the dispersion stability of the composition. The use of the surfactant facilitates the achievement of a reduced number of micro-defects and a reduced haze on polished surfaces.

The molecular weight of the surfactant is preferably $1 \times 10^4$ or less from the perspective of dispersibility of the composition and detergency performance on workpieces to be polished.

The lower limit of the molecular weight of the surfactant can can be selected according to the type of surfactant etc. The molecular weight of the surfactant is, for example, 200 or more, and for the purpose of reducing surface microdefects and haze, it is preferably 250 or more, more preferably 300 or more (e.g., 500 or more), even more preferably 2,000 or more, and particularly preferably 5,000 or more.

More specifically, the molecular weight of the surfactant is, for example, 200 to 10,000, preferably 250 to 10,000, and more preferably 300 to 10,000 (e.g., 2,000 to 10,000, or 5,000 to 10,000).

The molecular weight of the surfactant can be a weight-average molecular weight (Mw) determined by GPC (aqueous GPC, expressed on a polyethylene glycol equivalent basis) or a molecular weight calculated from the chemical formula of the surfactant.

The surfactant may be a water-soluble polymer having a molecular weight that falls within a range as exemplified above (e.g., an additional water-soluble polymer as exemplified above).

Specific examples of the surfactant include anionic surfactants and nonionic surfactants. Nonionic surfactants are preferred because of their low foaming tendency, ease of pH adjustment, etc.

The anionic surfactants include, for example, copolymers of multiple kinds of oxyalkylenes (e.g., diblock, triblock, random, or alternating copolymers of multiple kinds of oxy $C_{2-6}$ alkylenes, preferably oxy $C_{2-3}$ alkylenes), oxyalkylene polymers (e.g., polyethylene glycol, polypropylene glycol, polytetramethylene glycol, etc.), polyoxyalkylene adducts {e.g., polyoxy $C_{2-6}$ alkylene adducts, preferably polyoxy $C_{2-3}$ alkylene adducts such as polyoxyethylene adducts [e.g., polyoxyethylene alkyl ethers (e.g., polyoxyethylene propyl ether, polyoxyethylene butyl ether, polyoxyethylene pentyl ether, polyoxyethylene hexyl ether, polyoxyethylene octyl ether, polyoxyethylene-2-ethylhexyl ether, polyoxyethylene nonyl ether, polyoxyethylene decyl ether, polyoxyethylene isodecyl ether, polyoxyethylene tridecyl ether, polyoxyethylene lauryl ether, polyoxyethylene cetyl ether, polyoxyethylene stearyl ether, polyoxyethylene isostearyl ether, and polyoxyethylene oleyl ether), polyoxyethylene phenyl ether, polyoxyethylene alkyl phenyl ethers (e.g., polyoxyethylene octyl phenyl ether, polyoxyethylene nonyl phenyl ether, and polyoxyethylene dodecyl phenyl ether), polyoxyethylene styrenated phenyl ether, polyoxyethylene alkylamines (e.g., polyoxyethylene laurylamine, polyoxyethylene stearylamine, and polyoxyethylene oleylamine), polyoxyethylene alkylamides (e.g., polyoxyethylene stearyamide and polyoxyethylene oleylamide), polyoxyethylene fatty acid esters (e.g., polyoxyethylene monolaurate, polyoxyethylene monostearate, polyoxyethylene distearate, polyoxyethylene monooleate, and polyoxyethylene dioleate), polyoxyethylene glyceryl ether fatty acid esters, polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan monooleate, and polyoxyethylene sorbitan trioleate), polyoxyethylene sorbitol tetraoleate, polyoxyethylene castor oil, and polyoxyethylene hydrogenated castor oil]}, and acetylene glycol-based surfactants [e.g., alkylene oxide (e.g., ethylene oxide, etc.) adducts of acetylene glycol].

The copolymers of multiple kinds of oxyalkylenes include, for example, copolymers having an oxyethylene (EO) structure and an oxypropylene (PO) structure (copolymers having an EO-PO structure) {e.g., block copolymers of EO and PO [e.g., diblock copolymers of EO and PO, triblock copolymers of polyoxyethylene (PEO)-polyoxypropylene (PPO)-PEO, triblock copolymers of PPO-PEO-PPO, etc.], random copolymers of EO and PO, etc.}.

Among these nonionic surfactants, preferred are copolymers having an EO-PO structure, polyoxyethylene alkyl ethers, acetylene glycol-based surfactants, etc. Particularly preferred are block copolymers of EO and PO (in particular, triblock copolymers of PEO-PPO-PEO), random copolymers of EO and PO, polyoxyethylene alkyl ethers (e.g., polyoxyethylene decyl ether), etc.

The triblock copolymers of PEO-PPO-PEO are preferably polymers represented by the following general formula (2).

HO-(EO)a-(PO)b-(EO)c-H  (2)

In the general formula (2), EO represents an oxyethylene unit (—$CH_2CH_2O$—), PO represents an oxypropylene unit (—$CH_2CH(CH_3)O$—) group, and a, b and c each represent an integer of 1 or more (typically 2 or more).

In the general formula (2), the sum of a and c is an integer preferably in the range of 2 to 1,000, more preferably in the range of 5 to 500, and even more preferably in the range of 10 to 200.

In the general formula (2), b is an integer preferably in the range of 2 to 200, more preferably in the range of 5 to 100, and even more preferably in the range of 10 to 50.

The molar ratio of EO to PO (EO/PO ratio) in a block or random copolymer of EO and PO is preferably greater than 1, more preferably 2 or greater, and even more preferably 3 or greater (e.g., 5 or greater) from the perspective of water solubility, detergency performance, etc.

The acetylene glycol-based surfactant used in the present invention can be, for example, a commercially available product of Surfynol 400 series manufactured by Nissin Chemical Co., Ltd.

A single kind of surfactant or a combination of two or more kinds of surfactants may be used.

The HLB value of the surfactant is not particularly limited and is, for example, 8 to 20, preferably 10 to 20, and more preferably 15 to 20.

Abrasive Grains

The composition of the present invention may comprise abrasive grains.

The abrasive grains are not particularly limited, and examples include inorganic particles [e.g., inorganic oxides {e.g., metal oxides (e.g., alumina, cerium oxide, chromium oxide, titanium dioxide, zirconium oxide, magnesium oxide, manganese dioxide, zinc oxide, and bengalla), and semimetal oxides (e.g., silica)}, metal hydroxides [e.g., rare earth metal hydroxides (e.g., cerium hydroxide) and zirconium hydroxide], inorganic nitrides (e.g., silicon nitride and boron nitride), inorganic carbides (e.g., silicon carbide and boron carbide), inorganic carbonates {e.g., alkali metal carbonates (e.g., sodium carbonate and potassium carbonate), alkaline earth metal carbonates (e.g., calcium carbonate and barium carbonate), and other metal carbonates}, diamonds, etc.]; organic particles [e.g., polymers of unsaturated acids (e.g., poly(meth)acrylic acid), polymers of (meth)acrylic esters {e.g., poly(meth)acrylic acid alkyl esters (e.g., polymethyl methacrylate)}, polyacrylonitrile, etc.]; and organic-inorganic composite particles.

Among these abrasive grains, inorganic particles are preferred, inorganic oxides (e.g., metal oxides and semimetal oxides) are more preferred, and silicas (e.g., colloidal silica, fumed silica, and precipitated silica) are particularly preferred. Therefore, the abrasive grains may at least comprise silica. When the abrasive grains comprise silica, the amount of the silica in the abrasive grains is, for example, 50% by weight or more (e.g., 60% by weight or more), 70% by weight or more (80% by weight or more), 90% by weight or more (95% by weight or more, or 99% by weight or more), etc.

Among silicas, colloidal silica and fumed silica are preferred because they are less likely to generate scratches on the surface of workpieces to be polished and can be used to achieve a reduced haze on the polished surface. Colloidal silica is more preferred because of its low likelihood of generating scratches. High-purity colloidal silica is particularly preferred for preventing metal contamination.

A single kind of abrasive grains or a combination of two or more kinds of abrasive grains may be used.

The abrasive grains may be in any form without particular limitations. The abrasive grains may be in the form of primary particles, secondary particles, or a mixture of both; and are preferably in the form of particles containing at least secondary particles.

The average primary particle diameter Dpi of the abrasive grains is not particularly limited. From the perspective of polishing speed etc., the average primary particle diameter $D_{P1}$ is, for example, 5 nm or more, preferably 10 nm or more, more preferably 15 nm or more, and even more preferably 20 nm or more.

In addition, the average primary particle diameter $D_{P1}$ of the abrasive grains is preferably less than 100 nm, more preferably 50 nm or less, and even more preferably 40 nm or less for the purpose of haze reduction etc.

These upper and lower limits may be combined to set an appropriate range (e.g., 5 nm to 50 nm, 5 nm to 40 nm, etc.) for the average primary particle diameter $D_{P1}$ of the abrasive grains (the same applies to the others).

The average primary particle diameter $D_{P1}$ of the abrasive grains can be calculated, for example, based on the specific surface area S ($m^2/g$) as measured by the BET method, using the formula of $D_{P1}=2,720/S$ (nm).

The measurement of the specific surface area can be performed in any manner without particular limitations, for example, using a surface area measuring instrument, Flow Sorb II 2300 (trade name) manufactured by Micromeritics Instrument Corporation.

The average secondary particle diameter $D_{P2}$ of the abrasive grains is not particularly limited. From the perspective of polishing speed etc., the average secondary particle diameter $D_{P2}$ is, for example, 10 nm or more, and preferably 20 nm or more.

For the purpose of enhancing polishing performance etc., the average secondary particle diameter $D_{P2}$ of the abrasive grains is preferably 30 nm or more, more preferably 35 nm or more, and particularly preferably 40 nm or more (e.g., more than nm).

In addition, the average secondary particle diameter $D_{P2}$ Of the abrasive grains is, for example, less than 100 nm or less, preferably 90 nm or less, and more preferably 80 nm or less, so that the abrasive grains can easily be present in the polishing composition as particles of a size suitable for the purpose of microdefect reduction.

These upper and lower limits may be combined to set an appropriate range (e.g., 10 nm to 90 nm, 20 nm to 80 nm, etc.) for the average secondary particle diameter $D_{P2}$ of the abrasive grains (the same applies to the others).

The average secondary particle diameter $D_{P2}$ of the abrasive grains can be measured using a water dispersion of the abrasive grains (without any water-soluble polymer) by a laser diffraction scattering method, for example, using a particle size analyzer, the model UPA-UT151 manufactured by Nikkiso Co. Ltd.

The average secondary particle diameter $D_{P2}$ of the abrasive grains may be equal to or greater than the average primary particle diameter $D_{P1}$ ($D_{P2}/D_{P1} \geq 1$) or may be greater than $D_{P1}$ ($D_{P2}/D_{P1} > 1$).

The $D_{P2}/D_{P1}$ ratio of the abrasive grains is preferably in the range of 1 to 3 from the perspective of polishing performance and smoothness on polished surfaces.

The shape (outline) of the abrasive grains is not particularly limited and may be spherical or non-spherical {e.g., a peanut shape (i.e., a peanut shell shape), a cocoon shape, a kompeito shape, or a rugby ball shape}.

The average value of the ratio of the major diameter/minor diameter of the primary particles of the abrasive grains (average aspect ratio) is not particularly limited. From the perspective of polishing speed etc., the average aspect ratio is preferably 1.0 or more, more preferably 1.05 or more, and even more preferably 1.1 or more.

In addition, the average aspect ratio of the abrasive grains is preferably 3.0 or less, more preferably 2.0 or less, and even more preferably 1.5 or less for reducing the risk of generating scratches etc.

The shape (outline) and average aspect ratio of the abrasive grains can be confirmed, for example, by electron microscopy. The specific procedure is, for example, as follows. While abrasive particles are observed under a scanning electron microscope (SEM), a predetermined number (e.g., 200) of particles whose shapes are individually recognizable are selected, and the minimum rectangle circumscribed to the image of each particle is drawn. For each rectangle drawn for each particle image, the length of the long side (the value of the major diameter) is divided by the length of the short side (the value of the minor diameter) to calculate the ratio of the major diameter to the minor diameter (aspect ratio). The average aspect ratio can be obtained by arithmetically averaging the aspect ratios of the above predetermined number of particles.

pH Adjuster

The composition of the present invention may comprise a pH adjuster.

The pH adjuster is preferably a basic compound because it can enhance chemical polishing performance on the surface of workpieces to be polished, increase polishing speed, and improve the dispersion stability of the composition.

The use of basic compounds can increase the pH of the composition.

Examples of the basic compound include nitrogen-containing organic or inorganic basic compounds [e.g., quaternary ammonium hydroxides or their salts (e.g., tetramethylammonium hydroxide, tetraethylammonium hydroxide, tetrabutylammonium hydroxide, etc.), ammonia, amines (e.g., methylamine, dimethylamine, trimethylamine, ethylamine, diethylamine, triethylamine, ethylenediamine, monoethanolamine, N-(β-aminoethyl) ethanolamine, hexamethylenediamine, diethylenetriamine, triethylenetetramine, guanidine, etc.}, azoles (e.g., anhydrous piperazine, piperazine hexahydrate, 1-(2-aminoethyl) piperazine, N-methylpiperazine, imidazole, triazole, etc.), etc.], hydroxides of alkali metals or alkaline earth metals (e.g., potassium hydroxide, sodium hydroxide, etc.), carbonates (e.g., ammonium carbonate, potassium carbonate, sodium carbonate, etc.), and hydrogen carbonates (e.g., ammonium hydrogen carbonate, potassium hydrogen carbonate, sodium hydrogen carbonate, etc.).

Among these basic compounds, ammonia, alkali metal hydroxides (e.g., potassium hydroxide, sodium hydroxide, etc.), quaternary ammonium hydroxides or their salts (e.g., tetramethylammonium hydroxide, tetraethylammonium hydroxide, etc.), carbonates (e.g., ammonium carbonate, potassium carbonate, sodium carbonate, etc.), hydrogen carbonates (e.g., ammonium hydrogen carbonate, potassium hydrogen carbonate, sodium hydrogen carbonate, etc.), etc., are preferred because they can increase polishing speed etc. More preferred are ammonia, potassium hydroxide, sodium hydroxide, tetramethylammonium hydroxide, and tetraethylammonium hydroxide; even more preferred are ammonia and tetramethylammonium hydroxide; and particularly preferred is ammonia.

A single kind of basic compound or a combination of two or more kinds of basic compounds may be used.

Solvent

The composition of the present invention may comprise a solvent.

The solvent is not particularly limited, and examples include water and organic solvents (e.g., lower alcohols, lower ketones, etc.).

It is preferable that the solvent at least contains water. The amount of the water in the solvent is preferably 90% by volume or more, and more preferably 95% by volume or more (e.g., 99 to 100% by volume).

The water is preferably ion-exchanged water (deionized water), pure water, ultrapure water, distilled water, etc.

A total amount of transition metal ions in the water is preferably as little as 100 ppb or less in order to minimize the interference with the actions of the other components in the composition.

The water may be a water that has been highly purified, for example, by removal of ionic impurities using ion exchange resins, removal of foreign matter using filters, distillation, or other processes.

Additional Components

The composition may comprise an additional component in addition to the above components (the water-soluble polymer, abrasive grains, pH adjuster, surfactant, and solvent).

The additional component is not particularly limited and is, for example, a chelating agent, an organic acid, an organic acid salt, an inorganic acid, an inorganic acid salt, a preservative, a fungicide, and another additive.

Examples of the chelating agent include aminocarboxylic acid chelating agents and organic phosphonic acid chelating agents.

The aminocarboxylic acid chelating agents include ethylenediamine tetraacetic acid, sodium ethylenediamine tetraacetate, nitrilotriacetic acid, sodium nitrilotriacetate, ammonium nitrilotriacetate, hydroxyethyl ethylenediamine triacetic acid, sodium hydroxyethyl ethylenediamine triacetate, diethylenetriamine pentaacetic acid, sodium diethylenetriamine pentaacetate, triethylenetetramine hexaacetic acid, and sodium triethylenetetramine hexaacetate.

The organic phosphonic acid chelating agents include 2-aminoethylphosphonic acid, 1-hydroxyethylidene-1,1-diphosphonic acid, aminotri(methylenephosphonic acid), ethylenediamine tetrakis(methylenephosphonic acid), diethylenetriamine penta (methylenephosphonic acid), ethane-1,1-diphosphonic acid, ethane-1, 1, 2-triphosphonic acid, ethane-1-hydroxy-1, 1-diphosphonic acid, ethane-1-hydroxy-1, 1, 2-triphosphonic acid, ethane-1,2-dicarboxy-1,2-diphosphonic acid, methane hydroxyphosphonic acid, 2-phosphonobutane-1,2-dicarboxylic acid, 1-phosphonobutane-2, 3, 4-tricarboxylic acid, and a-methylphosphonosuccinic acid.

Among these chelating agents, organic phosphonic acid chelating agents are preferred, and ethylenediamine tetrakis (methylenephosphonic acid), diethylenetriamine penta (methylenephosphonic acid), etc. are particularly preferred.

Examples of the organic acid include fatty acids (e.g., formic acid, acetic acid, propionic acid, etc.), aromatic carboxylic acids (e.g., benzoic acid, phthalic acid, etc.), citric acid, oxalic acid, tartaric acid, malic acid, maleic acid, fumaric acid, succinic acid, organic sulfonic acid, and organic phosphonic acid.

Examples of the organic acid salt include alkali metal salts of organic acids (e.g., sodium salts, potassium salts, etc.) and ammonium salts of organic acids.

Examples of the inorganic acid include sulfuric acid, nitric acid, hydrochloric acid, and carbonic acid.

Examples of the inorganic acid salt include alkali metal salts of inorganic acids (e.g., sodium salts, potassium salts, etc.) and ammonium salts of inorganic acids.

Examples of the preservative and fungicide include isothiazoline compounds, paraoxybenzoic esters, and phenoxyethanol.

A single kind of additional component or a combination of two or more kinds of additional components may be used.

Modes of Composition

The composition may be directly used as a polishing solution. Alternatively, the composition may be diluted with a solvent (e.g., diluted at a dilution factor as described later) and used as a polishing solution. Further details are described later.

That is, the composition may be a less concentrated composition (a polishing solution) or a highly concentrated composition (a polishing concentrate).

The highly concentrated composition may be a concentrate of a less concentrated composition.

The amount of the water-soluble polymer in the composition (the proportion of the water-soluble polymer to the whole of the composition) is not particularly limited and is, for example, 1 ppm or more on a mass basis. For the purpose of haze reduction etc., it is preferably 3 ppm or more on a mass basis, and more preferably 5 ppm or more (e.g., 10 ppm or more) on a mass basis.

In addition, the amount of the water-soluble polymer in the composition is preferably 1,000 ppm or less on a mass basis, and more preferably 500 ppm or less (e.g., 300 ppm or less) on a mass basis from the perspective of polishing speed etc.

These upper and lower limits may be combined to set an appropriate range for the amount of the water-soluble polymer in the composition. More specifically, the amount of the water-soluble polymer in the composition is, for example, 1 ppm to 1,000 ppm, preferably 3 ppm to 500 ppm, and more preferably ppm to 300 ppm.

The amount of the water-soluble polymer, for example, in a highly concentrated composition, can be set according to the dilution factor etc. and is not particularly limited. The amount of the water-soluble polymer in the highly concentrated composition is, for example, 1,000 ppm or more on a mass basis, preferably 1,500 ppm or more on a mass basis, or 2,000 ppm or more on a mass basis.

In addition, the amount of the water-soluble polymer in the highly concentrated composition is preferably 20,000 ppm or less on a mass basis, and more preferably 10,000 ppm or less on a mass basis.

These upper and lower limits may be combined to set an appropriate range for the amount of the water-soluble polymer in the highly concentrated composition. More specifically, the amount of the water-soluble polymer in the highly concentrated composition is, for example, 1,000 ppm to 20,000 ppm, preferably 1,500 ppm to 10,000 ppm, and more preferably 2,000 ppm to 5,000 ppm.

In the case where the composition comprises abrasive grains, the amount of the abrasive grains in the composition (the proportion of the abrasive grains to the whole of the composition) is not particularly limited and is, for example, 0.01 mass % or more, preferably 0.05 mass % or more, and more preferably 0.1 mass % or more (e.g., 0.15 mass % or more, 0.2 mass % or more, 0.4 mass % or more, 0.6 mass % or more, or 0.8 mass % or more). A greater amount of the abrasive grains can result in a higher polishing speed.

In addition, the amount of the abrasive grains in the composition is, for example, 10 mass % or less, preferably 7 mass % or less, and more preferably 5 mass % or less for the purpose of achieving a reduced haze on polished surfaces.

These upper and lower limits may be combined to set an appropriate range for the amount of the abrasive grains in the composition. All combinations of these upper and lower limits are applicable. More specifically, the amount of the abrasive grains in the composition is, for example, 0.01 mass % to 10 mass %, preferably 0.05 mass % to 7 mass %, and more preferably 0.1 mass % to 5 mass %.

In particular, in the case where the composition comprises silica and a vinyl alcohol-based resin (A) having a polyoxyethylene group, the amount of the silica in the composition is, for example, more than 0.2 mass % and 7 mass % or less (e.g., more than 0.2 mass % and 5 mass % or less), preferably more than 0.3 mass % and 6 mass % or less (e.g., more than 0.3 mass % and 4 mass % or less), and more preferably more than 0.4 mass % and 5 mass % or less (e.g., more than 0.5 mass % and 4 mass % or less, or more than 0.6 mass % and 3 mass % or less).

The amount of the abrasive grains, for example, in a highly concentrated composition, can be set according to the dilution factor etc. and is not particularly limited. The amount of the abrasive grains in the highly concentrated composition is, for example, 0.2 mass % or more, preferably 1 mass % or more, and more preferably 2 mass % or more.

In addition, the amount of the abrasive grains in the highly concentrated composition is, for example, 50 mass % or less, preferably 20 mass % or less, and more preferably 10 mass % or less.

These upper and lower limits may be combined to set an appropriate range for the amount of the abrasive grains in the highly concentrated composition. More specifically, the amount of the abrasive grains in the highly concentrated composition is, for example, 0.2 mass % to 50 mass %, 1 mass % to 20 mass %, or 2 mass % to 10 mass %.

In the case where the composition comprises a pH adjuster, the amount of the pH adjuster in the composition (the proportion of the pH adjuster to the whole of the composition) is not particularly limited. From the perspective of polishing speed etc., the amount of the pH adjuster in the composition is, for example, 1 ppm or more, and preferably 5 ppm or more.

In addition, the amount of the pH adjuster in the composition is, for example, less than 1000 ppm, and preferably less than 500 ppm for the purpose of haze reduction etc.

These upper and lower limits may be combined to set an appropriate range for the amount of the pH adjuster in the composition. More specifically, the amount of the pH adjuster in the composition is, for example, 1 ppm or more and less than 1,000 ppm, or 5 ppm or more and less than 500 ppm.

The amount of the pH adjuster, for example, in a highly concentrated composition, can be set according to the dilution factor etc. and is not particularly limited. The amount of the pH adjuster in the highly concentrated composition is, for example, 20 ppm or more, and preferably 100 ppm or more.

In addition, the amount of the pH adjuster in the highly concentrated composition is, for example, less than 20,000 ppm, and preferably less than 10,000 ppm.

These upper and lower limits may be combined to set an appropriate range for the amount of the pH adjuster in the highly concentrated composition. More specifically, the amount of the pH adjuster in the highly concentrated composition is, for example, 20 ppm or more and less than 20,000 ppm, and preferably 100 ppm or more and less than 10,000 ppm.

In the case where the composition comprises a surfactant, the amount of the surfactant in the composition (the proportion of the surfactant to the whole of the composition) is not particularly limited. For the improvement in surface microdefects and haze, the amount of the surfactant in the composition is, for example, 0.1 ppm or more, preferably 0.5 ppm or more, more preferably 1 ppm or more (e.g., 3 ppm or more), and even more preferably 5 ppm or more (e.g., 10 ppm or more).

In addition, the amount of the surfactant in the composition is, for example, 1,000 ppm or less, preferably 500 ppm or less (e.g., 300 ppm or less), and more preferably 100 ppm or less from the perspective of polishing speed etc.

These upper and lower limits may be combined to set an appropriate range for the amount of the surfactant in the composition. More specifically, the amount of the surfactant in the composition is, for example, 0.1 ppm to 1,000 ppm, preferably 0.5 ppm to 500 ppm, and more preferably 1 ppm to 100 ppm.

The amount of the surfactant, for example, in a highly concentrated composition, can be set according to the dilution factor etc. and is not particularly limited. The amount of the surfactant in the highly concentrated composition is, for example, 2 ppm or more, preferably 10 ppm or more, more preferably 20 ppm or more, and even more preferably 100 ppm or more.

In addition, the amount of the surfactant in the highly concentrated composition is, for example, 20,000 ppm or less, preferably 10,000 ppm or less, and more preferably 2,000 ppm or less.

These upper and lower limits may be combined to set an appropriate range for the amount of the surfactant in the highly concentrated composition. More specifically, the amount of the surfactant in the highly concentrated composition is, for example, 2 ppm to 20,000 ppm, preferably 10 ppm to 10,000 ppm, and more preferably 20 ppm to 2,000 ppm.

The solid content of the composition is not particularly limited and is, for example, 0.01 mass % or more, preferably 0.01 mass % to 50 mass %, and more preferably 0.05 mass % to 40 mass %.

The solid content of the composition, for example, in a highly concentrated composition, can be set according to the dilution factor etc. and is not particularly limited. The solid content of the highly concentrated composition is, for example, 1 mass % or more, preferably 2 mass % to 50 mass %, and more preferably 5 mass % to 25 mass %.

The solid content can be expressed as a mass percentage of dry matter residue in the composition after drying the composition at 105° C. for 24 hours.

In the case where the composition comprises an additional component, the amount of the additional component in the composition (the proportion of the additional component to the whole of the composition) is not particularly limited and is, for example, 0.01 to 30 mass %, preferably 0.01 to 20 mass %, and more preferably 0.01 to 10 mass %.

The amount of the additional component, for example, in a highly concentrated composition, can be set according to the dilution factor etc. and is not particularly limited. The amount of the additional component in the highly concentrated composition is, for example, 0.2 to 60 mass %, preferably 0.2 to 40 mass %, and more preferably 0.2 to 20 mass %.

In the case where the composition comprises abrasive grains, the ratio of the water-soluble polymer and the abrasive grains in the composition is not particularly limited. The mass ratio of the water-soluble polymer: the abrasive grains is, for example, 10:1 to 1:1,000, preferably 5:1 to 1:500, and more preferably 1:1 to 1:100.

In the case where the composition comprises a surfactant, the ratio of the water-soluble polymer and the surfactant in the composition is not particularly limited. The mass ratio of the water-soluble polymer: the surfactant is, for example, 1:0.01 to 1:200, and preferably 1:0.01 to 1:100 (e.g., 1:0.01 to 1:20, more preferably 1:0.05 to 1:15, and particularly preferably 1:0.1 to 1:10).

The zeta potential of the composition is, for example, $-0$ mV or less, preferably $-5$ mV or less, and more preferably $-10$ mV or less for the purpose of preventing abrasive grains from agglomerating. In addition, the zeta potential of the composition is, for example, $-100$ mV or more, preferably $-90$ mV or more, and more preferably $-80$ mV or more from the perspective of polishing speed.

The zeta potential of the composition can be measured using, for example, an ultrasonic zeta potential measuring instrument, DT-1202 manufactured by Dispersion Technology, Inc.

Method for Producing the Composition

The method for producing the composition of the present invention is not particularly limited. For example, the components to be combined into the composition may be mixed together. Mixing may be performed at room temperature or with heating.

Mixing may be performed with stirring, optionally using a mixing device (e.g., a blade stirrer, an ultrasonic disperser, a homomixer, etc.).

The components may be added in any order without particular limitations. For example, the components may be mixed all at once or sequentially in a predetermined order.

During the production process of the composition, filtration may be performed.

Filtration may be filtering the components separately before mixing or filtering a mixture of the components.

The filtration method is not particularly limited and may use a filter, for example.

Filtration may be circulating filtration, etc.

Polishing

The surface of a workpiece to be polished can be polished with the composition of the present invention to produce a polished product.

The surface to be polished may be either both sides or one side of the workpiece.

In polishing both sides of the workpiece, both sides may be polished simultaneously or one after another.

A preferable embodiment of the method for polishing a workpiece to be polished using the composition of the present invention (a method for producing a polished product) will be described below.

The materials of the workpiece to be polished include, for example, metals or semimetals such as silicon, aluminum, nickel, tungsten, copper, tantalum, titanium, and stainless steel, or their alloys; glass-like materials such as quartz glass, aluminosilicate glass, and glass-like carbon; ceramic materials such as alumina, silica, sapphire, silicon nitride, tantalum nitride, and titanium carbide; compound semiconductor substrate materials such as silicon carbide, gallium nitride, and gallium arsenide; and resin materials such as polyimide resin.

Among these materials, silicon is preferably contained in the workpiece to be polished (e.g., monocrystalline silicon substrates).

The workpiece to be polished may be composed of multiple materials.

The workpiece to be polished may have a coat formed on the substrate, but in the present invention, it is preferable to polish the substrate itself, not a barrier layer formed on the substrate (e.g., a tantalum barrier layer to protect an insulating layer, etc.). The coat can be, for example, a polysilicon coat, a nitride coat, an oxide coat, etc. The thickness of the coat is, for example, more than 100 nm.

The surface to be polished may be a partially oxidized surface of the substrate (e.g., a natural oxide coat of 100 nm or less in thickness).

The shape of the workpiece to be polished is not particularly limited. For example, it is preferably a planar or polyhedral shape, which has a flat surface.

The area of the workpiece to be polished is not particularly limited and is, for example, about 7,000 to 200,000 mm$^2$ (e.g., about 7,850 to 196,250 mm$^2$), and preferably about 17,000 to 160,000 mm$^2$ (e.g., about 17,663 to 158,963 mm$^2$).

The polishing solution used for polishing may be the composition as it is or a diluted solution of the composition in a solvent.

The solvent for dilution can be a solvent as exemplified above and is preferably a solvent that at least contains water (an aqueous solvent). The solvent for dilution may be the same as or different from the solvent comprised in the composition of the present invention (in terms of the type of solvent or, when the solvent is a mixed solvent, the mixing ratio of the components).

The dilution factor is, for example, about 2 to 100 (e.g., about 5 to 50, or about 20 to 50), preferably 10 to 30, and more preferably 15 to 25 on a volume basis.

The polishing solution may be a pH-adjusted solution prepared with a pH adjuster as exemplified above.

The pH of the polishing solution can be selected according to the saponification value of the vinyl alcohol-based resin, the type of abrasive grains, etc. and is not particularly limited. The pH of the polishing solution is, for example, 8.0 to 12.0 (e.g., 9.0 to 11.0), or 5.0 to 9.0 (e.g., 6.0 to 8.0). The pH ranges described above are, for example, particularly preferably applicable for polishing solutions used for polishing silicon wafers (e.g., polishing solutions used for final polishing).

The polishing solution is applied to a workpiece to be polished, and the workpiece can be polished by the usual method.

The composition of the present invention is particularly suitable for use in polishing semiconductor substrates (particularly, silicon wafers).

The polishing step in which the composition is used is not particularly limited. For example, the composition is particularly suitable for use in the final polishing step or preceding polishing steps for silicon wafers.

The term "final polishing" usually refers to the last polishing step in the production process of the product of interest (i.e., a step after which no further polishing is performed). The composition of the present invention is effective, for example, for use in polishing silicon wafers that have been processed through preceding steps to have a surface roughness of 0.01 nm to 100 nm (typically for use in final polishing or in polishing immediately prior to final polishing), and is particularly suitable for use in final polishing.

For example, in the case of final polishing of a silicon wafer, a silicon wafer that has undergone a lapping step and primary and secondary polishing steps is set in a commonly used polishing machine, and a polishing solution is applied to the surface of the silicon wafer (the surface to be polished) through the polishing pad of the polishing machine. In an example, while the polishing solution is continuously supplied, the polishing pad is moved (e.g., rotationally) relative to the silicon wafer with the polishing pad pressed against the silicon wafer.

Cleaning

The polished product obtained as described above may be subjected to cleaning.

Cleaning can be performed, for example, using a cleaning solution.

The cleaning solution is not particularly limited. For example, the SC-1 cleaning solution (a mixture of ammonium hydroxide ($NH_4OH$), hydrogen peroxide ($H_2O_2$), and water ($H_2O$) can be used for polished semiconductor substrates.

The temperature of the cleaning solution can be, for example, room temperature to about 90° C.

Polished Product

The present invention also includes a polished product having a polished surface as described below.

The polished surface of the polished product satisfies the following requirement: the number of LLS defects of 26 nm or larger in size per area of 300 mm in diameter (i.e., a circular area of 300 mm in diameter: about 70, 650 mm$^2$) is preferably 700 or smaller, more preferably 300 or smaller, and even more preferably 100 or smaller.

The polished product of the present invention may be a polished product of a workpiece as exemplified above (e.g., a single-crystal silicon substrate, etc.), but it is preferred that the polished product is neither a polished product of a nitrogen-doped single-crystal silicon substrate, nor a polished product of a single-crystal silicon substrate in which an Nv-region and an Ni-region are mixed.

The number of LLS defects of 26 nm or larger in size can be measured, for example, by the method described in the section "Examples" below.

In addition, the polished surface of the polished product satisfies the following requirement: the number of LLS defects of 19 nm or larger in size per area of 300 mm in diameter (i.e., a circular area of 300 mm in diameter: about 70,650 mm$^2$) is preferably 850 or smaller, more preferably 550 or smaller, and even more preferably 250 or smaller.

The number of LLS defects of 19 nm or larger in size can be measured, for example, by the method described in the section "Examples" below.

As described above, the number of LLS defects is defined as the number of LLS defects per area of 300 mm in diameter, but the size of the workpiece to be polished is, of course, not limited to 300 mm in diameter.

The present invention focuses on surface defects that are too small in size to be measured using KLA Tencor's wafer defect inspection system marketed under the trade name "SP1" or "SP2". Such microscopic surface defects can be reduced in number according to the present invention. The defects that can be measured using SP1 and SP2 are larger in size than the defects that can be reduced in number according to the present invention, and therefore do not deserve to be counted for comparison to demonstrate the performance of the present invention.

The haze on the polished surface of the polished product is, for example, 0.3 ppm or less (e.g., less than 0.3 ppm), preferably 0.25 ppm or less (e.g., less than 0.25 ppm, or 0.01 ppm to 0.25 ppm), more preferably 0.20 ppm or less (e.g., less than 0.20 ppm, or 0.01 ppm to 0.20 ppm), particularly preferably 0.15 ppm or less (e.g., less than 0.15 ppm, or 0.01 ppm to 0.15 ppm), and most preferably 0.10 ppm or less (e.g., less than 0.10 ppm, or 0.01 ppm to 0.10 ppm).

The haze can be measured, for example, by the method described in the section "Examples" below.

The polished surface of the polished product has a root-mean-square (Sq) of preferably less than 0.030 nm, more preferably less than 0.028 nm as measured in a field of view of 30×30 µm² using an atomic force microscope.

The lower limit of the root mean square height (Sq) is not particularly specified. For example, Sq is 0.005 nm or more, 0.01 nm or more, etc.

The root-mean-square height (Sq) can be measured by the method described in the section "Examples" below.

In order to obtain polished products having a polished surface as described above, for example, workpieces to be polished are polished with a polishing composition comprising a certain water-soluble polymer and then cleaned.

The water-soluble polymer is, for example, a water-soluble polymer which has a long side-chain group [e.g., a side-chain group of 3 carbon atoms or more (e.g., a side-chain group of 3 carbon atoms or more as exemplified above for the vinyl alcohol-based resin (A)] and/or has a low viscosity (e.g., 300 mPa·s or less as measured in a 4% aqueous solution at 20° C.).

For example, vinyl alcohol-based resins are suitable for use as the water-soluble polymer. The use of the vinyl alcohol-based resin (A) or (B) described above in a polishing composition enables efficient production of a polished product having a polished surface as described above.

In addition, the water-soluble polymer may be a water-soluble polymer having a fewer properties seemingly responsible for microdefect generation (e.g., agglomeration, separation, thickening, gelation, etc.).

Furthermore, the water-soluble polymer may be a water-soluble polymer having a fewer coarse components and/or a lower metal impurity (e.g., Ni, Cu, etc.) content.

The water-soluble polymer may be obtained, for example, by filtration or ion exchange treatment.

EXAMPLES

Hereinafter, the present invention will be described in more detail by examples, but the present invention is not limited thereto.

In the following examples, "part(s)" and "%" refer to part(s) by mass and a percent by mass unless otherwise specified.

Physical properties were evaluated in the examples by the following methods.

(1) Residual Amount of Diacetone Acrylamide:
Calculated from the integral values of the assigned peaks in $^1$H-NMR measurement using $CDCl_3$ as a solvent.

(2) Residual Amount of Vinyl Acetate:
Calculated from the integral values of the assigned peaks in $^1$H-NMR measurement using $CDCl_3$ as a solvent.

(3) Residual Amount of Hexadecyl Vinyl Ether:
Calculated from the integral values of the assigned peaks in 1H-NMR measurement using $CDCl_3$ as a solvent.

(4) Polymerization Yield:
Each polymerization paste was absolutely dried, and the solid concentration was measured. The polymerization yield was determined by calculating the product of the solid concentration and the yield coefficient obtained by the formula shown below. When diacetone acrylamide and/or hexadecyl vinyl ether remained in the solids, their residual amounts were calculated from the integral values of the assigned peaks in $^1$H-NMR measurement using $CDCl_3$ as a solvent, and subtracted from the solid concentration. The solid concentration after subtraction was used for the calculation.

Yield coefficient=Total feed/monomer feed

The total feed in the above formula refers to the combined total amount of monomers, a solvent, an initiator, and other components fed into the reaction system for polymerization.

(5) Viscosity of 4% Aqueous Solution:
Measured according to JIS K 6726 (1994)

(6) Saponification Value:
Measured according to JIS K 6726 (1994).

(7) Diacetone Acrylamide Unit Content:
Calculated from the integral values of the assigned peaks in $^1$H-NMR measurement using DMSO-$d_6$ as a solvent.

(8) Hexadecyl Vinyl Ether Unit Content:
Calculated from the integral values of the assigned peaks in $^1$H-NMR measurement using DMSO-$d_6$ as a solvent.

Water-Soluble Polymers

Synthesis Example 1

Into a flask equipped with a stirrer, a thermometer, a dropping funnel and a reflux cooler, 2,000 parts of vinyl acetate, 604 parts of methanol, and 8.2 parts of diacetone acrylamide (DAAM) were fed. After nitrogen replacement in the system, the mixture was heated until the internal temperature reached 60° C. After the temperature was raised, polymerization was started by adding a solution of 1.2 parts of 2,2-azobisisobutyronitrile in 100 parts of methanol. Immediately after the start of polymerization, a solution of 127.8 parts of diacetone acrylamide in 80 parts of methanol was added dropwise to the flask at a constant rate under a continuous nitrogen flow. m-Dinitrobenzene was added as a polymerization terminator to stop the polymerization. The yield at the end of the polymerization was 73.8%.

To the resulting reaction mixture, methanol vapor was added to evaporate off the remaining vinyl acetate, thus giving a 50% methanol solution of a diacetone acrylamide-vinyl acetate copolymer. To 500 parts of this solution, 70 parts of methanol, 2 parts of ion-exchanged water, and 15 parts of a 4% methanol solution of sodium hydroxide were added and mixed well, and the mixture was subjected to a saponification reaction at 45° C. The resulting gelled product was pulverized, washed well with methanol, and dried to give a PVA-based resin (DA-PVA1). The viscosity of the obtained DA-PVA1 in a 4% aqueous solution was 20.5 mPa·s, and the saponification value was 98.6 mol %. The diacetone unit content of DA-PVA1 was 4.6 mol %.

Synthesis Examples 2 to 7

DA-PVA2 to DA-PVA7 shown in Table 1 or 2 were obtained as described in Synthesis Example 1, except that the feed ratios in the polymerization process and the saponification conditions were changed so that the PVA-based resins would have their respective modification degrees and saponification values as shown in Table 1 or 2.

Synthesis Example 8

Into a flask equipped with a stirrer, a thermometer, a dropping funnel and a reflux cooler, 2,000 parts of vinyl acetate, 781.7 parts of methanol, and 12.5 parts of hexadecyl vinyl ether (HDVE) were fed. After nitrogen replacement in the system, the mixture was heated until the internal temperature reached 60° C. After the temperature was raised, polymerization was started by adding a solution of 1.6 parts of 2, 2-azobisisobutyronitrile in 100 parts of methanol. Immediately after the start of polymerization, a solution of 141.1 parts of diacetone acrylamide in 80 parts of methanol was added dropwise to the flask at a constant rate under a continuous nitrogen flow. m-Dinitrobenzene was added as a polymerization terminator to stop the polymerization. The polymerization yield was 87.7%.

To the resulting reaction mixture, methanol vapor was added to evaporate off the remaining vinyl acetate and hexadecyl vinyl ether, thus giving a 53% methanol solution of diacetone acrylamide-hexadecyl vinyl ether-vinyl acetate copolymer. To 500 parts of this solution, 70 parts of methanol, 2 parts of ion-exchanged water, and 15 parts of a 4% methanol solution of sodium hydroxide were added and mixed well, and the mixture was subjected to a saponification reaction at 45° C. The resulting gelled product was pulverized, washed well with methanol, and dried to give a PVA resin (DAHD-PVA) shown in Table 1.

Synthesis Examples 9 to 18

PVA-1, PVA-2, PVA-6, and PVA-3 shown in Table 1 and PVA-8 to PVA-13 shown in Table 4 were obtained as described in Production Example 1 of JP-A 2013-153149, except that polymerization conditions (feed ratio, temperature, pressure, polymerization time, etc.) and saponification conditions (temperature, saponification time, etc.) were changed so that the PVAs would have their respective 4% solution viscosities and saponification values as shown in Table 1 or 4 (for PVA-3, the viscosity of a 4% aqueous solution would be 226.1 mPa·s, and the saponification value would be 99.3 mol %).

Example 1

To a 1% aqueous solution of colloidal silica having an average primary particle diameter of 35 nm (abrasive grains), a 29% aqueous solution of ammonia ($NH_3$, basic compound) was added to prepare a colloidal silica dispersion adjusted to pH 10.0. To this colloidal silica dispersion, DA-PVA1 was added at a final concentration of 100 ppm to obtain a composition (polishing solution). The silica content of the composition was 1%.

Examples 2 to 7

Compositions were obtained in the same manner as in Example 1, except that the water-soluble polymers shown in Table 1 were used and that, for the examples where EOPO is described, a copolymer having an EO-PO structure (Wako Pure Chemical Industries, polyoxyethylene polyoxypropylene glycol (160E.O.) (30P.O.)) was added at a final concentration of 10 ppm to the colloidal silica dispersion.

Examples 8 and 9

Compositions were obtained in the same manner as in Example 1, except that the water-soluble polymers shown in Table 1 were used and that, for the examples where EOPO is described, a copolymer having an EO-PO structure (Wako Pure Chemical Industries, polyoxyethylene polyoxypropylene glycol (160E.O.) (30P.O.)) was added at a final concentration of 10 ppm to the colloidal silica dispersion.

Examples 18 and 19

Compositions were obtained in the same manner as in Example 1, except that the water-soluble polymers shown in Table 1 were used and that, for the examples where EOPO is described, a copolymer having an EO-PO structure (Wako Pure Chemical Industries, polyoxyethylene polyoxypropylene glycol (160E.O.) (30P.O.)) was added at a final concentration of 10 ppm to the colloidal silica dispersion.

Example 20

A composition was obtained in the same manner as in Example 1, except that PVA-7, which was obtained by mixing PVA-3 and PVA-5 at PVA-3: PVA-5 (mass ratio) =82:18, was used as the PVA.

Comparative Example 1

A composition was obtained in the same manner as in Example 1, except that hydroxyethyl cellulose (Daicel Finechem, hydroxyethyl cellulose SE400) was used as the water-soluble polymer.

Comparative Example 2

A composition was obtained in the same manner as in Example 1, except that hydroxyethyl cellulose (Daicel Finechem, hydroxyethyl cellulose SE400) was used as the water-soluble polymer and that a copolymer having an EO-PO structure (Wako Pure Chemical Industries, polyoxyethylene polyoxypropylene glycol (160E.O.) (30P. O.)) was added at a final concentration of 10 ppm to the colloidal silica dispersion.

Comparative Example 3

A composition was obtained in the same manner as in Example 1, except that polyvinylpyrrolidone (Wako Pure Chemical Industries, polyvinylpyrrolidone K90) was used as the water-soluble polymer.

Reference Examples 1 to 3

Compositions were obtained in the same manner as in Example 1, except that the water-soluble polymers shown in Table 1 were used and that, for the examples where EOPO is described, a copolymer having an EO-PO structure (Wako Pure Chemical Industries, polyoxyethylene polyoxypropylene glycol (160E.O.) (30P.O.)) was added at a final concentration of 10 ppm to the colloidal silica dispersion.

The water-soluble polymers shown in Table 1 were as follows.
PVA-4: JMR-800HH, manufactured by Japan Vam & Poval
PVA-5: JMR-500HH, manufactured by Japan Vam & Poval Silicon Wafer Polishing The surfaces of silicon wafers were polished under the conditions shown below using the polishing solutions prepared in the examples described above.

The silicon wafers used were single-crystal silicon wafers having a diameter of 300 mm, a P-type conductivity, a crystal orientation <100>, a resistivity of 0.1 to 100 Ω·cm.

Polishing evaluations were performed at two stages: preliminary polishing to make the entire surface uniform and finish polishing with the above compositions using a single-wafer polishing machine, the model PNX-332B, manufactured by Okamoto Machine Tool Works, Ltd.

Preliminary Polishing Conditions
  Polishing cloth: Non-woven cloth
  Polishing solution: Colloidal silica solution adjusted to pH
  11 with KOH
  Polishing load: 30 kPa
  Plate rotation speed: 50 rpm
  Head rotation speed: 50 rpm
  Polishing time: 3 min.

Finish Polishing Conditions
  Polishing cloth: Suede
  Polishing load: 15 kPa
  Plate rotation speed: 30 rpm
  Head rotation speed: 30 rpm
  Polishing time: 3 min.

Cleaning

After polishing, silicon wafers were cleaned with a mixture of $NH_4OH$, $H_2O_2$, and ultrapure water (SC1) (volume ratio of $NH_4OH$: $H_2O_2$: ultrapure water=1:3:30).

Microdefect Inspection

Number of LLS Defects of 26 nm or Larger in Size

The surfaces of the silicon wafers after cleaning were inspected using a wafer defect inspection system manufactured by KLA Tencor, trade name "SP3", to determine the number of LLS defects of 26 nm or more in size per area of 300 mm in diameter. The results were evaluated on a four-level scale shown below. The number of LLS defects was measured on a silicon wafer surface of 300 mm in diameter, excluding an area of 3 mm from the outer circumference.
  A: the number detected is 100 or less.
  B: the number detected is more than 100 and 300 or less.
  C: the number detected is more than 300 and 700 or less.
  D: the number is more than 700.

Number of LLS Defects of 19 nm or Larger in Size

The surfaces of the silicon wafers after cleaning were inspected using a wafer defect inspection system manufactured by KLA Tencor, trade name "SP5", to determine the number of LLS defects of 19 nm or more in size per area of 300 mm in diameter. The results were evaluated on a four-level scale shown below. The number of LLS defects was measured on a silicon wafer surface of 300 mm in diameter, excluding an area of 3 mm from the outer circumference.
  A: the number detected is 250 or less.
  B: the number detected is more than 250 and 550 or less.
  C: the number detected is more than 550 and 850 or less.
  D: the number is more than 850.

Haze Measurement

The haze (ppm) on the surfaces of the silicon wafers after cleaning was measured using a wafer inspection system manufactured by KLA Tencor, trade name "SP3", in a DWO mode. The results of the measurements were evaluated on a four-level scale as follows.
  A: less than 0.10 ppm
  B: 0.10 ppm or more and less than 0.20 ppm
  C: 0.20 ppm or more and less than 0.30 ppm
  D: 0.30 ppm or more AFM Roughness Measurement The surfaces of the silicon wafers after cleaning were evaluated by atomic force microscopy (AFM). The observation was made at three points with coordinates (0 mm, 0 mm), (75 mm, 0 mm), and (145 mm, 0 mm), and the field of view was 30×30 μm$^2$ in each point. For roughness parameters, after slope correction in the X and Y directions, root-mean-square height (Sq) was calculated, and the average of the three point measurements was used as an evaluation index. The results were evaluated on a three-level scale as follows.
  A: less than 0.028 nm
  B: 0.028 nm or more and less than 0.030 nm
  C: 0.030 nm or more The results are shown in Table 1.

The evaluation results for Examples 1 to 9, Examples 18 to 20, Comparative Examples 1 to 3, and Reference Examples 1 to 3 are shown in Table 1.

TABLE 1

| | | Water-soluble polymer | | | | | Evaluation results | | |
| --- | --- | --- | --- | --- | --- | --- | --- | --- | --- |
| | Polymer name | 4% aqueous solution viscosity (mPa · s) | Saponification value (mol %) | Monomer used for modification | Modification degree (mol %) | Amount (ppm) | LLS defects of 26 nm or larger in size | Haze | AFM roughness |
| Example 1 | DA-PVA1 | 20.5 | 98.6 | DAAM | 4.6 | 100 | C | C | A |
| Example 2 | DA-PVA2 | 27.4 | 98.7 | DAAM | 4.0 | 100 | C | C | A |
| Example 3 | DA-PVA3 | 6.6 | 98.7 | DAAM | 3.4 | 100 | C | C | A |
| Example 4 | DA-PVA3 EOPO | 6.6 | 98.7 | DAAM | 3.4 | 100 10 | A | A | A |
| Example 5 | DA-PVA2 EOPO | 27.4 | 98.7 | DAAM | 4.0 | 100 10 | A | A | A |
| Example 6 | DAHD-PVA | 149.1 | 99.0 | DAAM HDVE | 3.5 0.3 | 100 | C | B | A |
| Example 7 | DAHD-PVA EOPO | 149.1 | 99.0 | DAAM HDVE | 3.5 0.3 | 100 10 | A | A | A |
| Example 8 | PVA-1 | 2.8 | 99.3 | | | 100 | C | C | C |
| Example 9 | PVA-2 | 10.4 | 98.5 | | | 100 | B | C | C |
| Example 18 | PVA-6 | 41.1 | 98.6 | | | 100 | B | B | B |
| Example 19 | PVA-6 EOPO | 41.1 | 98.6 | | | 100 10 | A | A | A |
| Example 20 | PVA-7 | 296.6 | 99.3 | | | 100 | C | B | B |
| Comparative Example 1 | HEC | | | | | 100 | D | B | B |

TABLE 1-continued

| | Water-soluble polymer | | | | | Evaluation results | | |
|---|---|---|---|---|---|---|---|---|
| | Polymer name | 4% aqueous solution viscosity (mPa · s) | Saponification value (mol %) | Monomer used for modification | Modification degree (mol %) | Amount (ppm) | LLS defects of 26 nm or larger in size | Haze | AFM roughness |
| Comparative Example 2 | HEC EOPO | | | | | 100 10 | D | A | A |
| Comparative Example 3 | PVP | | | | | 100 | D | B | C |
| Reference Example 1 | PVA-4 | 2450 | 99.0 | | | 100 | D | A | A |
| Reference Example 2 | PVA-4 EOPO | 2450 | 99.0 | | | 100 10 | D | A | A |
| Reference Example 3 | PVA-5 | 618.0 | 99.5 | | | 100 | D | B | A |

As shown in Table 1, the number of LLS defects of 26 nm or larger in size was smaller in Examples 1 to 9 and 18 to 20.

In addition, haze was lower in Examples 1 to 9 and 18 to 20.

Furthermore, AFM roughness was lower in Examples 1 to 9 and 18 to 20.

Examples 10 to 17

Compositions were obtained in the same manner as in Example 1, except that the water-soluble polymers shown in Table 2 were used and that, for the examples where EOPO is described, a copolymer having an EO-PO structure (Wako Pure Chemical Industries, polyoxyethylene polyoxypropylene glycol (160E.O.) (30P.O.)) was added at a final concentration of 10 ppm to the colloidal silica dispersion. The evaluation results are shown in Table 2.

In addition, the evaluation results for Examples 1 to 5 in terms of the number of LLS defects of 19 nm or larger in size are shown in Table 3.

TABLE 2

| | Water-soluble polymer | | | | | | Evaluation results | | |
|---|---|---|---|---|---|---|---|---|---|
| | Polymer name | 4% aqueous solution viscosity (mPa · s) | Saponification value (mol %) | Monomer used for modification | Modification degree (mol %) | Amount (ppm) | LLS defects of 19 nm or larger in size | Haze | AFM roughness |
| Example 10 | DA-PVA4 | 28.6 | 99.0 | DAAM | 0.8 | 100 | C | C | A |
| Example 11 | DA-PVA4 EOPO | 28.6 | 99.0 | DAAM | 0.8 | 100 10 | A | A | A |
| Example 12 | DA-PVA5 | 24.4 | 98.7 | DAAM | 6.7 | 100 | C | C | A |
| Example 13 | DA-PVA5 EOPO | 24.4 | 98.7 | DAAM | 6.7 | 100 10 | A | A | A |
| Example 14 | DA-PVA6 | 54.5 | 98.8 | DAAM | 3.8 | 100 | B | C | A |
| Example 15 | DA-PVA6 EOPO | 54.5 | 98.8 | DAAM | 3.8 | 100 10 | A | A | A |
| Example 16 | DA-PVA7 | 194.1 | 98.6 | DAAM | 4.3 | 100 | B | C | A |
| Example 17 | DA-PVA7 EOPO | 194.1 | 98.6 | DAAM | 4.3 | 100 10 | A | A | A |

TABLE 3

| | Water-soluble polymer | | | | | | Evaluation results LLS defects of 19 nm or larger in size |
|---|---|---|---|---|---|---|---|
| | Polymer name | 4% aqueous solution viscosity (mPa · s) | Saponification value (mol %) | Monomer used for modification | Modification degree (mol %) | Amount (ppm) | |
| Example 1 | DA-PVA1 | 20.5 | 98.6 | DAAM | 4.6 | 100 | B |
| Example 2 | DA-PVA2 | 27.4 | 98.7 | DAAM | 4.0 | 100 | B |
| Example 3 | DA-PVA3 | 6.6 | 98.7 | DAAM | 3.4 | 100 | B |
| Example 4 | DA-PVA3 EOPO | 6.6 | 98.7 | DAAM | 3.4 | 100 10 | A |
| Example 5 | DA-PVA2 EOPO | 27.4 | 98.7 | DAAM | 4.0 | 100 10 | A |

As shown in Tables 2 and 3, the number of LLS defects of 19 nm or larger in size was smaller in Examples 1 to 5 and 10 to 17.

As shown in Table 2, haze was lower in Examples 10 to 17. In addition, AFM roughness was lower in Examples 10 to 17.

Examples 21 to 30

Compositions were obtained in the same manner as in Example 1, except that a 1% colloidal silica dispersion (pH 7.2) containing colloidal silica having an average primary particle diameter of 35 nm was used as the abrasive grains and that the water-soluble polymers shown in Table 4 were used.

For the examples where EOPO is described, a copolymer having an EO-PO structure was added as described above.

Comparative Example 4

A composition was obtained in the same manner as in Example 21, except that hydroxyethyl cellulose (Daicel Finechem, hydroxyethyl cellulose SE400) was used as the water-soluble polymer.

Comparative Example 5

A composition was obtained in the same manner as in Example 21, except that hydroxyethyl cellulose (Daicel Finechem, hydroxyethyl cellulose SE400) was used as the water-soluble polymer and that a copolymer having an EO-PO structure (Wako Pure Chemical Industries, polyoxyethylene polyoxypropylene glycol (160E.O.) (30P.O.)) was added at a final concentration of 10 ppm to the colloidal silica dispersion.

The evaluation results for Examples 21 to 30 and Comparative Examples 4 and 5 are shown in Table 4.

INDUSTRIAL APPLICABILITY

The composition of the present invention is very industrially useful because it can be used for polishing workpieces to achieve, for example, a reduced number of LLS defects on the polished surface, thus enabling efficient processing of substrates that have a protective coat formed on their surface.

The invention claimed is:

1. A polishing composition comprising a water-soluble polymer, wherein the water-soluble polymer at least comprises a vinyl alcohol-based resin (A) having a side-chain group of 3 carbon atoms or more, and
wherein the side-chain group comprises at least one group selected from the group consisting of a group derived from a $C_{7-30}$ fatty acid vinyl ester, a group derived from a $C_{3-30}$ alkyl vinyl ether, a group derived from an aromatic carboxylic acid vinyl ester, a group derived from diacetone (meth)acrylamide, an acetoacetyl group, an epoxy ring-opening product of a group derived from an epoxy group-containing vinyl monomer, and a polyoxyethylene group.

2. A polishing composition comprising a water-soluble polymer, wherein the water-soluble polymer at least comprises at least one vinyl alcohol-based resin (B) which is a vinyl alcohol-based resin (B1) having a saponification value of more than 90 mol % and a viscosity of 300 mPa·s or less as measured in a 4% aqueous solution of the vinyl alcohol-based resin (B1) at 20° C.

3. The polishing composition according to claim 1, wherein the side-chain group comprises at least one group selected from the group consisting of a group derived from a $C_{7-30}$ fatty acid vinyl ester, a group derived from a $C_{3-30}$ alkyl vinyl ether, a group derived from an aromatic carboxylic acid vinyl ester, a group derived from diacetone (meth)

TABLE 4

| | Water-soluble polymer | | | | | Evaluation results | | |
|---|---|---|---|---|---|---|---|---|
| | Polymer name | 4% aqueous solution viscosity (mPa·s) | Saponification value (mol %) | Monomer used for modification | Modification degree (mol %) | Amount (ppm) | LLS defects of 26 nm or larger in size | Haze | AFM roughness |
| Example 21 | DA-PVA3 | 6.6 | 98.7 | DAAM | 3.4 | 100 | C | C | A |
| Example 22 | DA-PVA3 EOPO | 6.6 | 98.7 | DAAM | 3.4 | 100 10 | A | A | A |
| Example 23 | DA-PVA2 | 27.4 | 98.7 | DAAM | 4.0 | 100 | C | C | A |
| Example 24 | DA-PVA2 EOPO | 27.4 | 98.7 | DAAM | 4.0 | 100 10 | A | A | A |
| Example 25 | PVA-8 | 5.0 | 87.8 | | | 100 | C | C | C |
| Example 26 | PVA-9 | 25.4 | 88.0 | | | 100 | C | B | B |
| Example 27 | PVA-10 | 44.5 | 88.3 | | | 100 | B | B | B |
| Example 28 | PVA-11 | 171.2 | 88.1 | | | 100 | B | B | A |
| Example 29 | PVA-12 | 297.0 | 89.4 | | | 100 | B | B | A |
| Example 30 | PVA-13 | 1386 | 88.8 | | | 100 | B | B | A |
| Comparative Example 4 | HEC | | | | | 100 | D | C | B |
| Comparative Example 5 | HEC EOPO | | | | | 100 10 | D | B | A |

As shown in Table 4, the number of LLS defects of 26 nm or larger in size was smaller in Examples 21 to 30.

In addition, haze was lower in Examples 21 to 30.

Furthermore, AFM roughness was lower in Examples 21 to 30.

acrylamide, an acetoacetyl group, and an epoxy ring-opening product of a group derived from an epoxy group-containing vinyl monomer.

4. The polishing composition according to claim 1, wherein the side-chain group comprises at least one group selected from the group consisting of a group derived from an aromatic carboxylic acid vinyl ester, a group derived from diacetone (meth)acrylamide, and a polyoxyethylene group.

5. The polishing composition according to claim 1, wherein the side-chain group comprises at least one group selected from the group consisting of a group derived from a $C_{3-30}$ alkyl vinyl ether and a group derived from diacetone (meth)acrylamide.

6. The polishing composition according to claim 1, wherein the side-chain group at least comprises a group derived from diacetone (meth)acrylamide.

7. The polishing composition according to claim 1, wherein the side-chain group of 3 carbon atoms or more in the vinyl alcohol-based resin (A) comprises a group derived from an alkyl vinyl ether having 4 carbon atoms or more, wherein a 4% aqueous solution of the vinyl alcohol-based resin (A) has a viscosity of 100 mPa·s or more at 20° C., and wherein the vinyl alcohol-based resin (A) has a number-average molecular weight of 10,000 or more.

8. The polishing composition according to claim 1, wherein the amount of the side-chain group is 0.05 mol % or more in terms of polymerization components (monomers).

9. The polishing composition according to claim 2, wherein the vinyl alcohol-based resin (B) substantially consists of a vinyl alcohol unit and a vinyl ester unit and the composition further comprises abrasive grains.

10. The polishing composition according to claim 1, wherein the vinyl alcohol-based resin (A) has a saponification value of 80 to 99.9 mol %, and wherein a 4% aqueous solution of the vinyl alcohol-based resin (A) has a viscosity of 1 to 300 mPa·s at 20° C.

11. The polishing composition according to claim 1, further comprising abrasive grains.

12. The polishing composition according to claim 1, further comprising a pH adjuster.

13. The polishing composition according to claim 1, further comprising abrasive grains and a pH adjuster, wherein the abrasive grains comprise silica, and wherein the pH adjuster comprises a basic compound.

14. The polishing composition according to claim 2, wherein the composition further comprises abrasive grains and the abrasive grains comprise silica.

15. The polishing composition according to claim 1, further comprising a surfactant.

16. The polishing composition according to claim 1, further comprising a surfactant, wherein the surfactant comprises at least one selected from the group consisting of polyoxyethylene alkyl ethers and copolymers having an oxyethylene-oxypropylene structure.

17. The polishing composition according to claim 1, further comprising a surfactant, wherein the mass ratio of the water-soluble polymer and the surfactant is 1:0.01 to 1:200.

18. The polishing composition according to claim 1, further comprising a solvent at least containing water, wherein the concentration of the water-soluble polymer in the polishing composition is 1 ppm or more.

19. The polishing composition according to claim 1, further comprising a solvent at least containing water, wherein the polishing composition has a solid content of 0.01 mass % or more.

20. The polishing composition according to claim 1, wherein when a workpiece to be polished has been polished with the polishing composition and cleaned, the polished surface of the workpiece satisfies the following requirement (A):
 (A) the number of localized light scattering (LLS) defects of 26 nm or larger in size per area of 300 mm in diameter is 700 or smaller.

21. The polishing composition according to claim 1, wherein when a workpiece to be polished has been polished with the polishing composition and cleaned, the polished surface of the workpiece satisfies the following requirement (B):
 (B) the number of localized light scattering (LLS) defects of 19 nm or larger in size per area of 300 mm in diameter is 850 or smaller.

22. A method for producing a polished product, comprising the step of polishing the surface of a workpiece to be polished with the polishing composition according to claim 1.

23. The method for producing a polished product according to claim 22, further comprising the step of diluting the polishing composition with a solvent at least containing water, wherein the polishing step uses the diluted solution obtained in the dilution step to polish the surface of the workpiece.

24. The method for producing a polished product according to claim 22, wherein the polished product has a surface that satisfies the following requirement (A):
 (A) the number of localized light scattering (LLS) defects of 26 nm or larger in size per area of 300 mm in diameter is 700 or smaller.

25. A polishing composition comprising a water-soluble polymer, wherein the water-soluble polymer at least comprises a vinyl alcohol-based resin (A) having a side-chain group of 3 carbon atoms or more, wherein the vinyl alcohol-based resin (A) has a saponification value of 80 to 99.9 mol %, and wherein a 4% aqueous solution of the vinyl alcohol-based resin (A) has a viscosity of 1 to 300 mPa·s at 20° C.

* * * * *